US011694754B2

United States Patent
Shibazaki

(10) Patent No.: US 11,694,754 B2
(45) Date of Patent: Jul. 4, 2023

(54) SEMICONDUCTOR MEMORY DEVICE THAT PROVIDES A MEMORY DIE

(71) Applicant: Kioxia Corporation, Tokyo (JP)

(72) Inventor: Yuzuru Shibazaki, Fujisawa (JP)

(73) Assignee: Kioxia Corporation, Tokyo (JP)

( * ) Notice: Subject to any disclaimer, the term of this patent is extended or adjusted under 35 U.S.C. 154(b) by 17 days.

(21) Appl. No.: 17/469,095

(22) Filed: Sep. 8, 2021

(65) Prior Publication Data
US 2022/0180945 A1    Jun. 9, 2022

(30) Foreign Application Priority Data

Dec. 9, 2020  (JP) ................. 2020-204377

(51) Int. Cl.
*G11C 7/00* (2006.01)
*G11C 16/32* (2006.01)
*G11C 16/34* (2006.01)
*G11C 16/10* (2006.01)
*G11C 16/04* (2006.01)

(52) U.S. Cl.
CPC .......... *G11C 16/32* (2013.01); *G11C 16/0483* (2013.01); *G11C 16/10* (2013.01); *G11C 16/3459* (2013.01)

(58) Field of Classification Search
CPC ..... G11C 16/32; G11C 16/0483; G11C 16/10; G11C 16/3459; G11C 5/145; G11C 11/5671; G11C 16/08; G11C 16/30
USPC ........................................................ 365/221
See application file for complete search history.

(56) References Cited

U.S. PATENT DOCUMENTS

| | | | |
|---|---|---|---|
| 7,512,002 B2 * | 3/2009 | Kim ............. | G11C 16/08 365/185.11 |
| 8,325,532 B2 | 12/2012 | Makino | |
| 9,666,296 B1 | 5/2017 | Maejima | |
| 10,720,208 B2 | 7/2020 | Suzuki | |
| 10,937,502 B2 | 3/2021 | Hashimoto | |
| 2005/0047209 A1 * | 3/2005 | Masuoka ....... | G11C 16/0483 365/185.26 |

(Continued)

FOREIGN PATENT DOCUMENTS

| | | |
|---|---|---|
| JP | 2010-257530 A | 11/2010 |
| JP | 6581019 B2 | 9/2019 |

(Continued)

*Primary Examiner* — Tha-O H Bui
(74) *Attorney, Agent, or Firm* — Oblon, McClelland, Maier & Neustadt, L.L.P.

(57) ABSTRACT

ABSTRACT A semiconductor memory device provides a first memory cell array including a plurality of first memory blocks, a second memory cell array comprising a plurality of second memory blocks, and a voltage supply line electrically connected to the plurality of first memory blocks and the plurality of second memory blocks. Moreover, this semiconductor memory device is configured to execute a write operation. At a first timing of this write operation, the voltage supply line is not electrically continuous with the first and second memory blocks. Moreover, a voltage of the voltage supply line at the first timing in the case of the write operation being executed on the first and second memory blocks is larger than a voltage of the voltage supply line at the first timing in the case of the write operation being executed on the first memory block.

18 Claims, 15 Drawing Sheets

(56) References Cited

U.S. PATENT DOCUMENTS

| | | | |
|---|---|---|---|
| 2009/0244968 A1* | 10/2009 | Maejima | G11C 16/10 365/185.11 |
| 2011/0157989 A1* | 6/2011 | Iwata | G11C 16/0483 365/185.17 |
| 2018/0277220 A1* | 9/2018 | Nakagawa | G11C 16/3459 |

FOREIGN PATENT DOCUMENTS

| | | |
|---|---|---|
| JP | 2020-47329 A | 3/2020 |
| JP | 2020-144961 A | 9/2020 |

* cited by examiner

SEMICONDUCTOR MEMORY DEVICE THAT PROVIDES A MEMORY DIE

CROSS-REFERENCE TO RELATED APPLICATIONS

This application is based upon and claims the benefit of Japanese Patent Application No. 2020-204377, filed on Dec. 9, 2020, the entire contents of which are incorporated herein by reference.

BACKGROUND

Field

Embodiments relate to a semiconductor memory device.

Description of the Related Art

There is known a semiconductor memory device comprising a plurality of memory planes.

DETAILED DESCRIPTION

Figure 1:
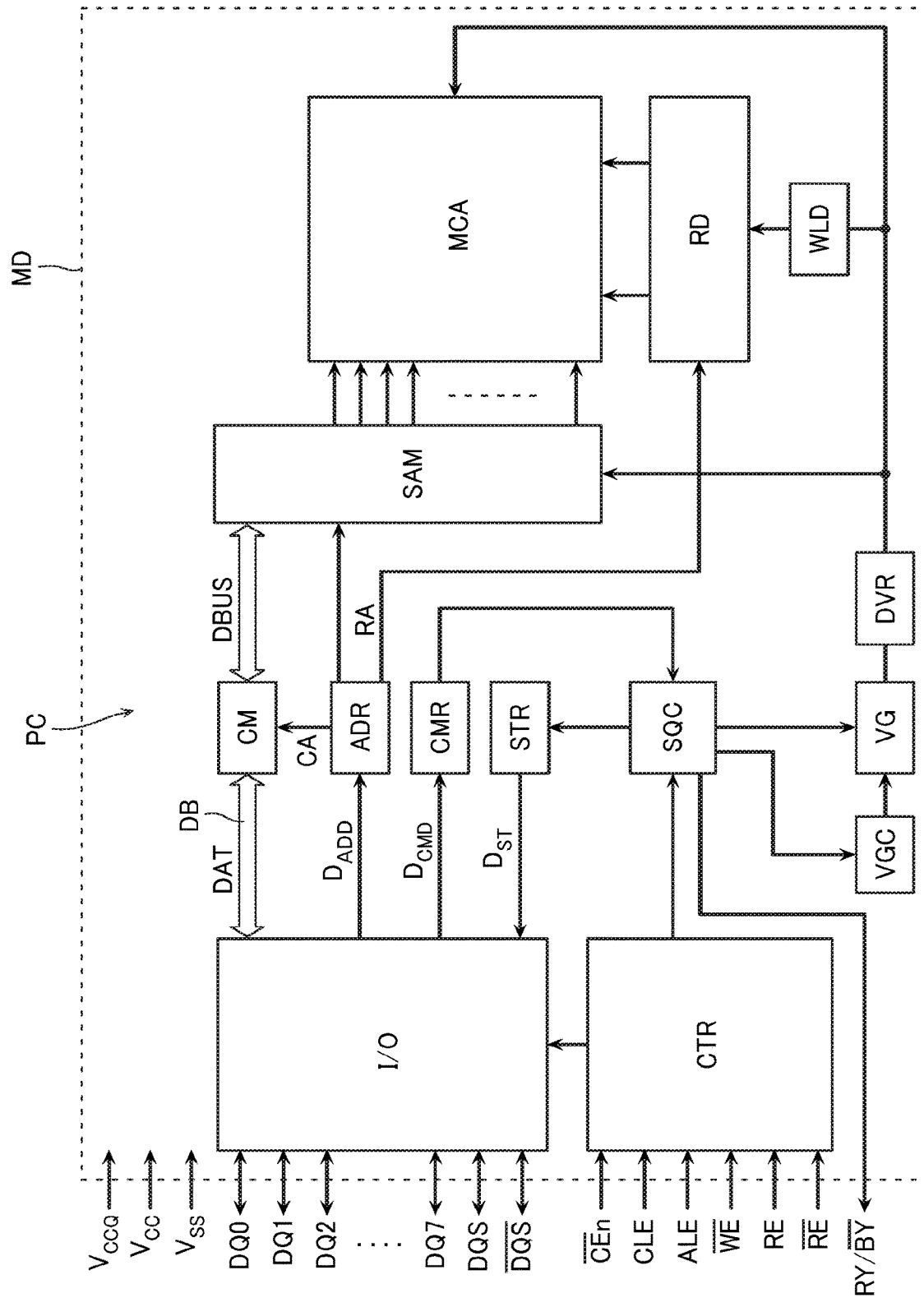
FIG. 1 is a schematic block diagram showing a configuration of a memory die MD according to a first embodiment.

A semiconductor memory device according to an embodiment comprises a memory die. The memory die comprises: a first memory cell array that comprises a plurality of first memory blocks; a second memory cell array that comprises a plurality of second memory blocks; and a voltage supply line which is electrically connected to the plurality of first memory blocks and the plurality of second memory blocks. Moreover, this semiconductor memory device is capable of executing a write operation. At a first timing of this write operation, the voltage supply line is not electrically continuous with any one of the plurality of first memory blocks and the plurality of second memory blocks. Moreover, in the case of the write operation being executed on any one of the plurality of first memory blocks and not being executed on any one of the plurality of second memory blocks, the voltage supply line is supplied with a first voltage at the first timing. Moreover, in the case of the write operation being executed on any one of the plurality of first memory blocks and being executed on any one of the plurality of second memory blocks, the voltage supply line is supplied with a second voltage at the first timing. Moreover, the second voltage is larger than the first voltage.

Next, semiconductor memory devices according to embodiments will be described in detail with reference to the drawings. Note that the following embodiments are merely examples, and are not shown with the intention of limiting the present invention. Moreover, the following drawings are schematic, and, for convenience of description, some configurations, and so on, thereof will sometimes be omitted. Moreover, portions that are common to a plurality of embodiments will be assigned with the same symbols, and descriptions thereof will sometimes be omitted.

Moreover, when a "semiconductor memory device" is referred to in the present specification, it will sometimes mean a memory die, and will sometimes mean a memory system including a control die, of the likes of a memory chip, a memory card, or an SSD (Solid State Drive). Furthermore, it will sometimes mean a configuration including a host computer, of the likes of a smartphone, a tablet terminal, or a personal computer.

Moreover, when a "control circuit" is referred to in the present specification, it will sometimes mean a peripheral circuit of the likes of a sequencer provided in a memory die, will sometimes mean the likes of a controller die or controller chip connected to the memory die, and will sometimes mean a configuration including both of these.

Moreover, in the present specification, when a first configuration is said to be "electrically connected" to a second configuration, the first configuration may be connected to the second configuration directly, or the first configuration may be connected to the second configuration via the likes of a wiring, a semiconductor member, or a transistor. For example, even when, in the case of three transistors having been serially connected, the second transistor is in an OFF state, the first transistor is still "electrically connected" to the third transistor.

Moreover, in the present specification, when a first configuration is said to be "connected between" a second configuration and a third configuration, it will sometimes mean that the first configuration, the second configuration, and the third configuration are serially connected, and the second configuration is connected to the third configuration via the first configuration.

Moreover, in the present specification, when a circuit, or the like, is said to "make electrically continuous" two wirings, or the like, this will sometimes mean, for example, that this circuit, or the like, includes a transistor, or the like, that this transistor, or the like, is provided in a current path between the two wirings, and that this transistor, or the like, is in an ON state.

Moreover, in the present specification, a certain direction parallel to an upper surface of a substrate will be referred to as an X direction, a direction parallel to the upper surface of the substrate and perpendicular to the X direction will be referred to as a Y direction, and a direction perpendicular to the upper surface of the substrate will be referred to as a Z direction.

Moreover, in the present specification, sometimes, a direction lying along a certain plane will be referred to as a first direction, a direction intersecting the first direction along this certain plane will be referred to as a second direction, and a direction intersecting this certain plane will be referred to as a third direction. These first direction, second direction, and third direction may, but need not, correspond to any of the X direction, the Y direction, and the Z direction.

Moreover, in the present specification, expressions such as "up" or "down" will be defined with reference to the substrate. For example, an orientation of moving away from the substrate along the above-described Z direction will be referred to as up, and an orientation of coming closer to the substrate along the Z direction will be referred to as down. Moreover, when a lower surface or a lower end is referred to for a certain configuration, this will be assumed to mean a surface or end portion on a substrate side of this configuration, and when an upper surface or an upper end is referred to for a certain configuration, this will be assumed to mean a surface or end portion on an opposite side to the substrate of this configuration. Moreover, a surface intersecting the X direction or the Y direction will be referred to as a side surface, and so on.

First Embodiment

[Circuit Configuration of Memory Die MD]

FIG. 1 is a schematic block diagram showing a configuration of a memory die MD according to a first embodiment. FIGS. 2 to 7 are schematic circuit diagrams showing configurations of parts of the memory die MD.

Note that in FIG. 1, a plurality of control terminals, and so on, are illustrated. These plurality of control terminals are in some cases indicated as a control terminal corresponding to a high active signal (a positive logic signal), in some cases indicated as a control terminal corresponding to a low active signal (a negative logic signal), and in some cases indicated as a control terminal corresponding to both a high active signal and a low active signal. In FIG. 1, a symbol of a control terminal corresponding to a low active signal includes an overline. In the present specification, a symbol of a control terminal corresponding to a low active signal includes a slash ("/"). Note that description of FIG. 1 is an exemplification, and that a specific mode is appropriately adjustable. For example, it is possible too for some or all of the high active signals to be configured as low active signals, or for some or all of the low active signals to be configured as high active signals.

As shown in FIG. 1, the memory die MD comprises: a memory cell array MCA that stores data; and a peripheral circuit PC connected to the memory cell array MCA. The peripheral circuit PC comprises a voltage generating circuit VG, a voltage generation control circuit VGC, a driver circuit DRV, a word line decoder WLD, a row decoder RD, a sense amplifier module SAM, and a sequencer SQC. In addition, the peripheral circuit PC comprises a cache memory CM, an address register ADR, a command register CMR, and a status register STR. Moreover, the peripheral circuit PC comprises an input/output control circuit I/O and a logic circuit CTR.

[Circuit Configuration of Memory Cell Array MCA]

Figure 2:
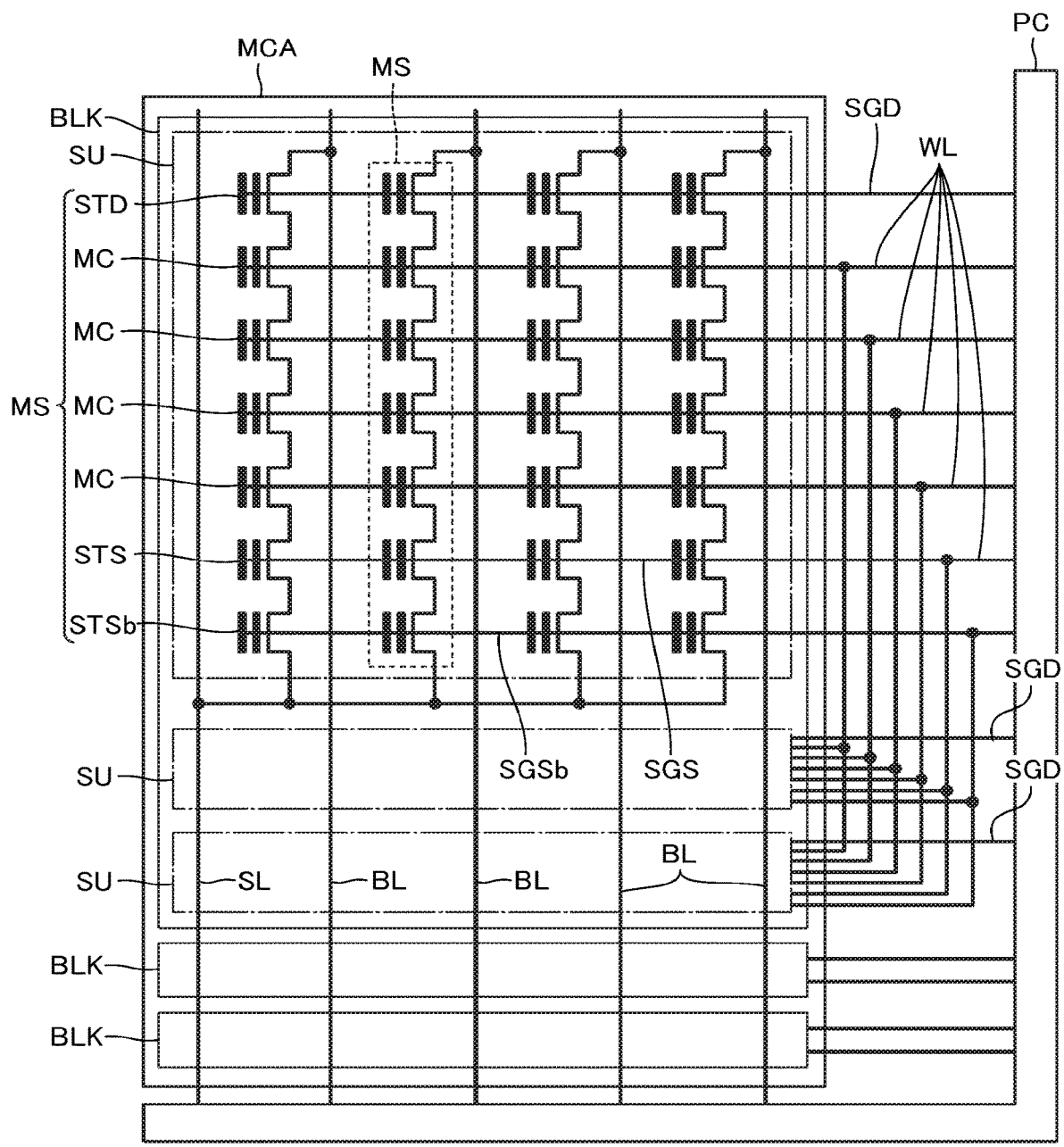
FIG. 2 is a schematic circuit diagram showing a configuration of a memory cell array MCA.

As shown in FIG. 2, the memory cell array MCA comprises a plurality of memory blocks BLK. These plurality of memory blocks BLK each comprise a plurality of string units SU. These plurality of string units SU each comprise a plurality of memory strings MS. One ends of these plurality of memory strings MS are respectively connected to the peripheral circuit PC via bit lines BL. Moreover, the other ends of these plurality of memory strings MS are each connected to the peripheral circuit PC via a common source line SL.

The memory string MS comprises a drain side select transistor STD, a plurality of memory cells MC (memory transistors), a source side select transistor STS, and a source side select transistor STSb that are connected in series between the bit line BL and the source line SL. Hereafter, the drain side select transistor STD, the source side select transistor STS, and the source side select transistor STSb will sometimes simply be referred to as select transistors (STD, STS, STSb).

The memory cell MC is a field effect type transistor that comprises: a semiconductor layer functioning as a channel region; a gate insulating film including a charge accumulating film; and a gate electrode. A threshold voltage of the memory cell MC changes according to an amount of charge in the charge accumulating film. The memory cell MC stores 1 bit or a plurality of bits of data. Note that the gate electrodes of the plurality of memory cells MC corresponding to one memory string MS are respectively connected to word lines WL. These word lines WL are respectively commonly connected to all of the memory strings MS in one memory block BLK.

The select transistors (STD, STS, STSb) are field effect type transistors that each comprise: a semiconductor layer functioning as a channel region; a gate insulating film; and agate electrode. The gate electrodes of the select transistors (STD, STS, STSb) are respectively connected with select gate lines (SGD, SGS, SGSb). A drain side select gate line SGD is provided correspondingly to the string unit SU and is commonly connected to all of the memory strings MS in one string unit SU. A source side select gate line SGS is commonly connected to all of the memory strings MS in a plurality of the string units SU. A source side select gate line SGSb is commonly connected to all of the memory strings MS in a plurality of the string units SU.

[Circuit Configuration of Voltage Generating Circuit VG]

Figure 3:
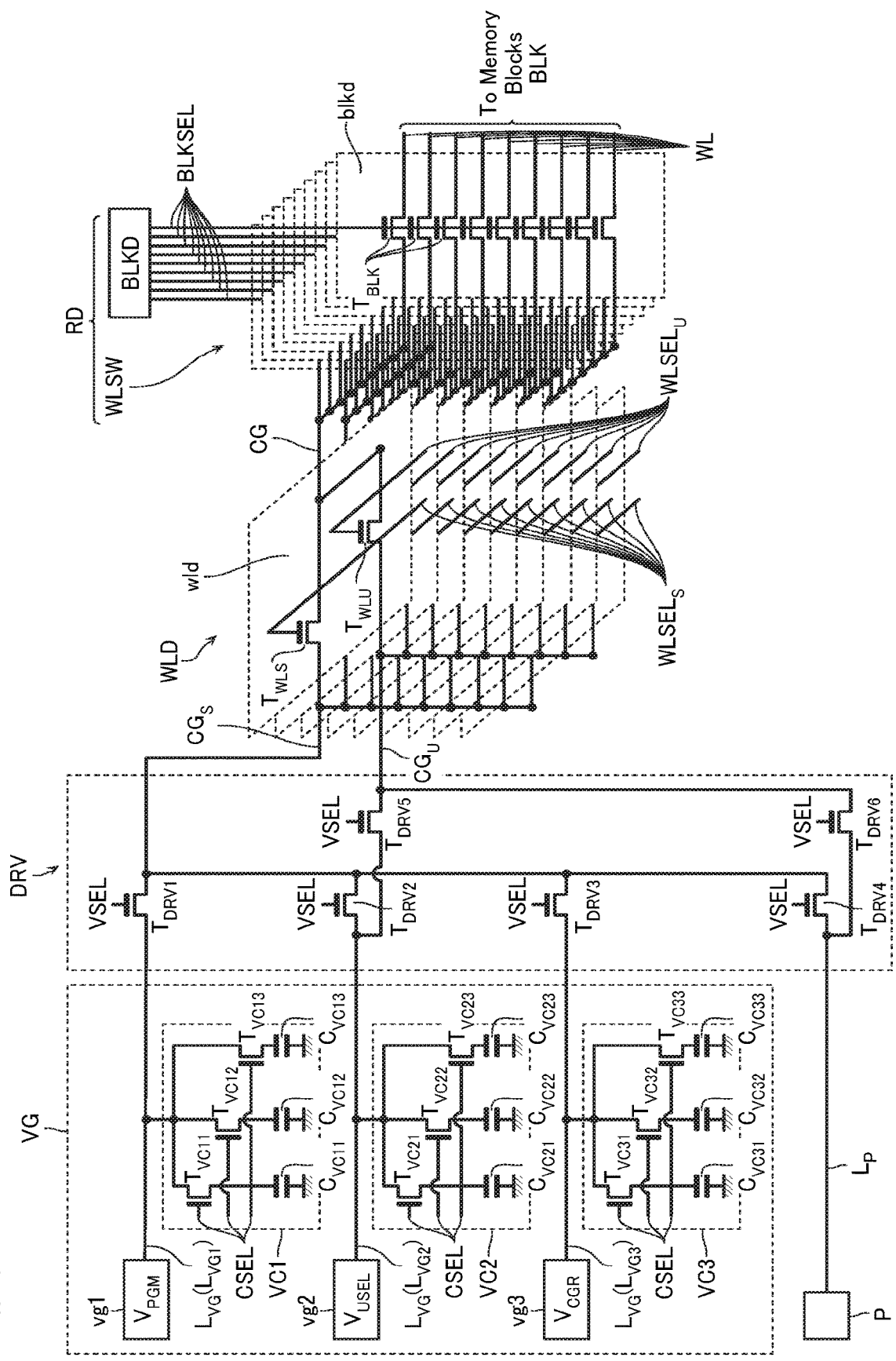
FIG. 3 is a schematic circuit diagram showing a voltage supply route from a voltage generating circuit VG to a memory block BLK.

As shown in FIG. 3, the voltage generating circuit VG (FIG. 1) comprises a plurality of voltage generating units vg1, vg2, vg3, for example. Hereafter, the voltage generating units vg1, vg2, vg3 will sometimes simply be referred to as voltage generating units vg. Moreover, the number disposed of the voltage generating units vg shown in FIG. 3 is an example, and the specific number disposed is appropriately adjustable.

The voltage generating circuit VG generates a voltage of a certain magnitude and outputs the generated voltage via a voltage supply line $L_{VG}$, in a read operation, a write operation, and an erase operation. Although details will be mentioned later with reference to FIG. 14, in the write operation, the voltage generating unit vg1 outputs a program voltage $V_{PGM}$, for example. Moreover, the voltage generating unit vg2 outputs a write pass voltage $V_{PASS}$ or a read pass voltage $V_{READ}$ smaller than the program voltage $V_{PGM}$, for example.

Moreover, the voltage generating unit vg3 outputs a verify voltage $V_{VFY}$ smaller than the write pass voltage $V_{PASS}$ and the read pass voltage $V_{READ}$, for example. Note that the voltage supply line $L_{VG}$ connected to the voltage generating unit vg1 will sometimes be referred to as a voltage supply line $L_{VG1}$, the voltage supply line $L_{VG}$ connected to the voltage generating unit vg2 will sometimes be referred to as a voltage supply line $L_{VG2}$, and the voltage supply line $L_{VG}$ connected to the voltage generating unit vg3 will sometimes be referred to as a voltage supply line $L_{VG3}$.

The voltage generating unit vg may be a booster circuit such as a charge pump circuit, or may be a step-down circuit such as a regulator, for example. These step-down circuit and booster circuit are each connected to voltage supply lines $L_P$ (FIGS. 4 and 5) supplied with a power supply voltage $V_{CC}$ and a ground voltage $V_{SS}$ (FIG. 1).

The voltage generating circuit VG generates a plurality of types of operation voltages, according to a control signal from the sequencer SQC and a control signal from the voltage generation control circuit VGC, for example. These plurality of types of operation voltages are applied to the bit lines BL, the source line SL, the word lines WL, and the select gate lines (SGD, SGS, SGSb) during the read operation, the write operation, and the erase operation on the memory cell array MCA, for example. These plurality of types of operation voltages are simultaneously outputted to the plurality of voltage supply lines $L_{VG}$. These plurality of types of operation voltages are appropriately adjusted according to the control signal from the sequencer SQC and the control signal from the voltage generation control circuit VGC.

Moreover, as shown in FIG. 3, the voltage generating circuit VG comprises variable capacitance circuits VC1, VC2, VC3. The variable capacitance circuit VC1 is connected to the voltage supply line $L_{VG1}$ connected to the voltage generating unit vg1. The variable capacitance circuit VC2 is connected to the voltage supply line $L_{VG2}$ connected to the voltage generating unit vg2. The variable capacitance circuit VC3 is connected to the voltage supply line $L_{VG3}$ connected to the voltage generating unit vg3.

The variable capacitance circuit VC1 is configured having parallelly connected therein: a first series circuit in which a transistor $T_{VC11}$ and a capacitor $C_{VC11}$ have been serially connected; a second series circuit in which a transistor $T_{VC12}$ and a capacitor $C_{VC12}$ have been serially connected; and a third series circuit in which a transistor $T_{VC13}$ and a capacitor $C_{VC13}$ have been serially connected.

The transistors $T_{VC11}$, $T_{VC12}$, $T_{VC13}$ are field effect type NMOS transistors, for example. Drain electrodes of the transistors $T_{VC11}$, $T_{VC12}$, $T_{VC13}$ are connected to the voltage supply line $L_{VG1}$ Source electrodes of the transistors $T_{VC11}$, $T_{VC12}$, $T_{VC13}$ are connected to terminals on one sides of the capacitors $C_{VC11}$, $C_{VC12}$, $C_{VC13}$ Gate electrodes of the transistors $T_{VC11}$, $T_{VC12}$, $T_{VC13}$ are connected to a signal supply line CSEL. Terminals on the other sides of the capacitors $C_{VC11}$, $C_{VC12}$, $C_{VC13}$ are grounded. Capacitances of the capacitors $C_{VC11}$, $C_{VC12}$, $C_{VC13}$ may differ from each other. For example, the capacitances may be reduced in a stepwise manner in order of the capacitors $C_{VC11}$, $C_{VC12}$, $C_{VC13}$.

The variable capacitance circuit VC2 is configured having parallelly connected therein: a fourth series circuit in which a transistor $T_{VC21}$ and a capacitor $C_{VC21}$ have been serially connected; a fifth series circuit in which a transistor $T_{VC22}$ and a capacitor $C_{VC22}$ have been serially connected; and a sixth series circuit in which a transistor $T_{VC23}$ and a capacitor $C_{VC23}$ have been serially connected.

Drain electrodes of the transistors $T_{VC21}$, $T_{VC22}$, $T_{VC23}$ are connected to the voltage supply line $L_{VG2}$. Source electrodes of the transistors $T_{VC21}$, $T_{VC22}$, $T_{VC23}$ are connected to terminals on one sides of the capacitors $C_{VC21}$, $C_{VC22}$, $C_{VC23}$ Gate electrodes of the transistors $T_{VC21}$, $T_{VC22}$, $T_{VC23}$ are connected to the signal supply line CSEL. Terminals on the other sides of the capacitors $C_{VC21}$, $C_{VC22}$, $C_{VC23}$ are grounded. Capacitances of the capacitors $C_{VC21}$, $C_{VC22}$, $C_{VC23}$ may differ from each other. For example, the capacitances may be reduced in a stepwise manner in order of the capacitors $C_{VC21}$, $C_{VC22}$, $C_{VC23}$.

The variable capacitance circuit VC3 is configured having parallelly connected therein: a seventh series circuit in which a transistor $T_{VC31}$ and a capacitor $C_{VC31}$ have been serially connected; an eighth series circuit in which a transistor $T_{VC32}$ and a capacitor $C_{VC32}$ have been serially connected; and a ninth series circuit in which a transistor $T_{VC33}$ and a capacitor $C_{VC33}$ have been serially connected.

Drain electrodes of the transistors $T_{VC31}$, $T_{VC32}$, $T_{VC33}$ are connected to the voltage supply line $L_{VG3}$. Source electrodes of the transistors $T_{VC31}$, $T_{VC32}$, $T_{VC33}$ are connected to terminals on one sides of the capacitors $C_{VC31}$, $C_{VC32}$, $C_{VC33}$ Gate electrodes of the transistors $T_{VC31}$, $T_{VC32}$, $T_{VC33}$ are connected to the signal supply line CSEL. Terminals on the other sides of the capacitors $C_{VC31}$, $C_{VC32}$, $C_{VC33}$ are grounded. Capacitances of the capacitors $C_{VC31}$, $C_{VC32}$, $C_{VC33}$ may differ from each other. For example, the capacitances may be reduced in a stepwise manner in order of the capacitors $C_{VC31}$, $C_{VC32}$, $C_{VC33}$.

Now, an example of the charge pump circuit employed as the voltage generating unit vg will be described with reference to FIG. 4. A charge pump circuit 32 shown in FIG. 4 comprises: a voltage output circuit 32a that outputs a voltage $V_{OUT}$ to the voltage supply line $L_{VG}$; a voltage dividing circuit 32b connected to the voltage supply line $L_{VG}$; and a comparator 32c that outputs a feedback signal FB to the voltage output circuit 32a depending on a magnitude relationship of a voltage $V_{OUT}'$ outputted from the voltage dividing circuit 32b and a reference voltage $V_{REF}$.

Figure 5:
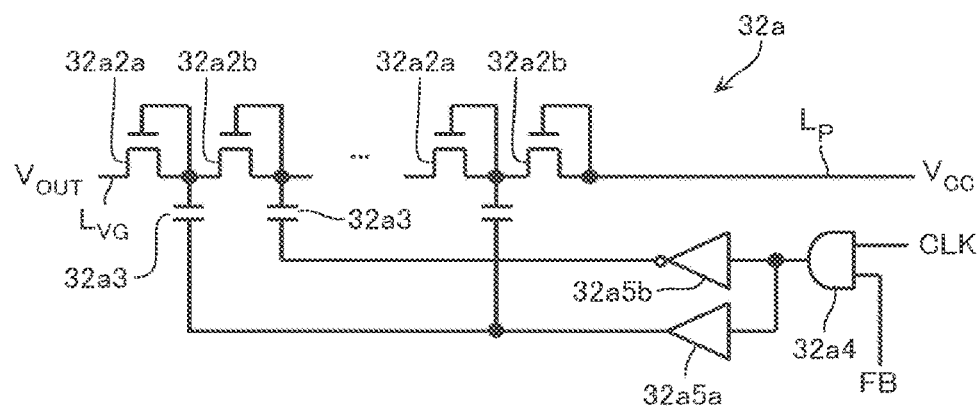
FIG. 5 is a schematic circuit diagram showing a configuration of a voltage output circuit 32a of the charge pump circuit 32.

As shown in FIG. 5, the voltage output circuit 32a comprises a plurality of transistors 32a2a, 32a2b connected to each other between the voltage supply line $L_{VG}$ and the voltage supply line $L_P$. The voltage supply line $L_P$ illustrated is supplied with the power supply voltage $V_{CC}$. Gate electrodes of the serially connected plurality of transistors 32a2a, 32a2b are connected to their respective drain electrodes and capacitors 32a3. Moreover, the voltage output circuit 32a comprises: an AND circuit 32a4 that outputs a logical sum of a clock signal CLK and the feedback signal FB; a level shifter 32a5a that outputs in a boosted state an output signal of the AND circuit 32a4; and a level shifter 32a5b that outputs in a boosted state an inverted signal of the output signal of the AND circuit 32a4. An output signal of the level shifter 32a5a is connected to the gate electrode of the transistor 32a2a via the capacitor 32a3. All output signal of the level shifter 32a5b is connected to the gate electrode of the transistor 32a2b via the capacitor 32a3.

When the feedback signal FB is in an "H" state, the clock signal CLK is outputted from the AND circuit 32a4. As a result, electrons are transported to the voltage supply line $L_P$ from the voltage supply line $L_{VG}$, and a voltage of the voltage supply line $L_{VG}$ increases. On the other hand, when the feedback signal FB is in an "L" state, the clock signal CLK is not outputted from the AND circuit 32a4. Hence, the voltage of the voltage supply line $L_{VG}$ does not increase.

Figure 4:
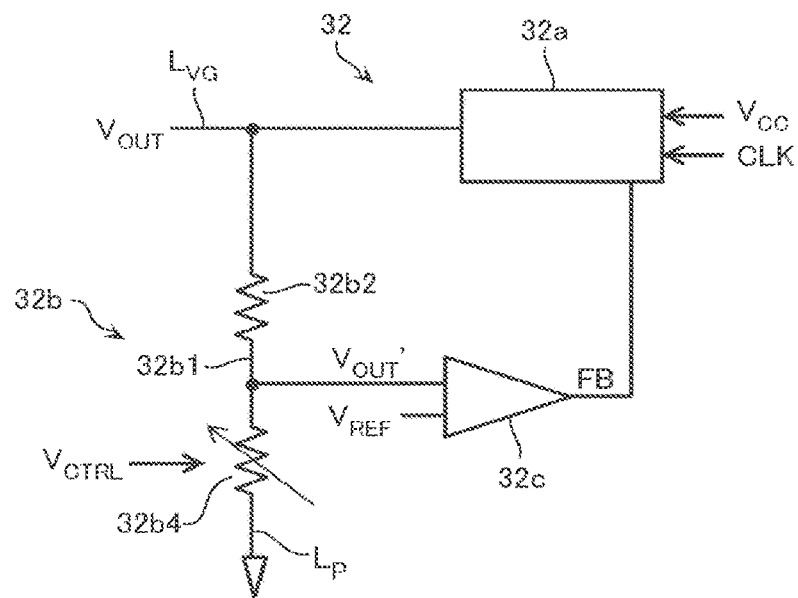
FIG. 4 is a schematic circuit diagram showing a configuration of a charge pump circuit 32.

As shown in FIG. 4, the voltage dividing circuit 32b comprises: a resistance element 32b2 connected between the voltage supply line $L_{VG}$ and a voltage dividing terminal 32b1; and a variable resistance element 32b4 serially connected between the voltage dividing terminal 32b1 and the voltage supply line $L_P$. The voltage supply line $L_P$ illustrated is supplied with the ground voltage $V_{SS}$. A resistance value of the variable resistance element 32b4 is adjustable depending on an operation voltage control signal $V_{CTRL}$. Hence, a magnitude of the voltage $V_{OUT}'$ of the voltage dividing terminal 32b1 is adjustable depending on the operation voltage control signal $V_{CTRL}$.

Figure 6:
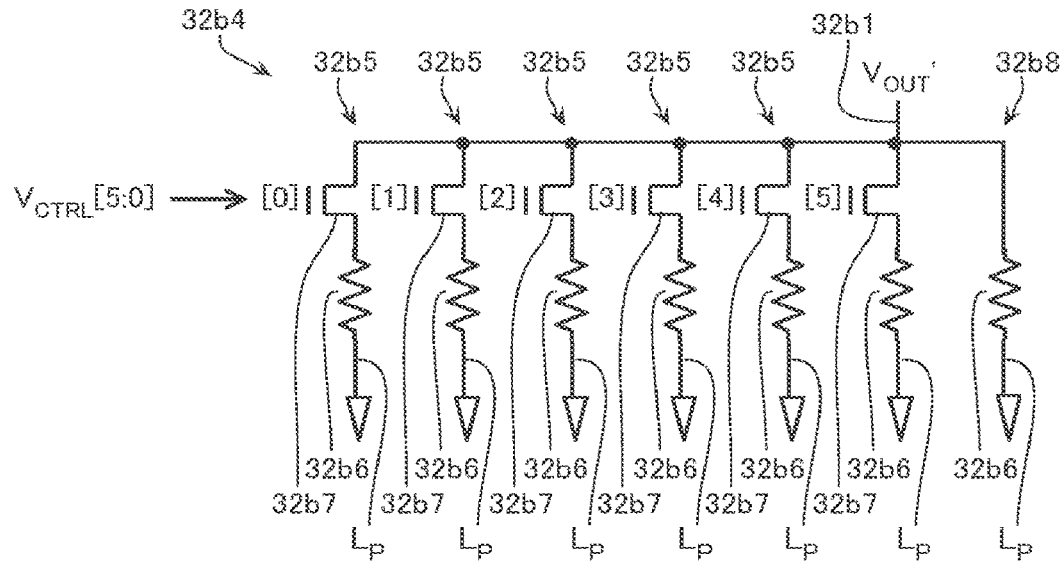
FIG. 6 is a schematic circuit diagram showing a configuration of a variable resistance element 32b4 of the charge pump circuit 32.

As shown in FIG. 6, the variable resistance element 32b4 comprises a plurality of current paths 32b5 connected in parallel between the voltage dividing terminal 32b1 and the voltage supply line $L_P$. These plurality of current paths 32b5 each comprise a resistance element 32b6 and a transistor 32b7 that are serially connected. Resistance values of the resistance elements 32b6 provided to each of the current paths 32b5 may have magnitudes that differ from each other. Gate electrodes of the transistors 32b7 provided to each of the current paths 32b5 are respectively inputted with different bits of the operation voltage control signal $V_{CTRL}$. Moreover, the variable resistance element 32b4 may have a current path 32b8 that does not include the transistor 32b7.

As shown in FIG. 4, the comparator 32c outputs the feedback signal FB. The feedback signal FB attains an "L" state when, for example, the voltage $V_{OUT}'$ of the voltage dividing terminal 32b1 is larger than the reference voltage $V_{REF}$. Moreover, the feedback signal FB attains an "H" state when, for example, the voltage $V_{OUT}'$ is smaller than the reference voltage $V_{REF}$.

[Circuit Configuration of Voltage Generation Control Circuit VGC]

The voltage generation control circuit VGC (FIG. 1) is a circuit that, during the write operation, performs the following kinds of control, depending on the number of memory cell arrays MCA (FIG. 8) that are to undergo write, for example.

(1) Adjusting each of voltage values outputted from the voltage generating units vg1, vg2, vg3 of the voltage generating circuit VG (FIG. 3).

(2) Performing ON/OFF control of each of the transistors $T_{VC11}$, $T_{VC12}$, $T_{VC13}$, $T_{VC21}$, $T_{VC22}$, $T_{VC23}$, $T_{VC31}$, $T_{VC32}$, $T_{VC33}$ of the variable capacitance circuits VC1, VC2, VC3 of the voltage generating circuit VG (FIG. 3) via the signal supply line CSEL, and thereby controlling which capacitors of each of the capacitors $C_{VC11}$, $C_{VC12}$, $C_{VC13}$, $C_{VC21}$, $C_{VC22}$, $C_{VC23}$, $C_{VC31}$, $C_{VC32}$, $C_{VC33}$ are to be made electrically continuous with the voltage supply lines $L_{VG1}$, $L_{VG2}$, $L_{VG3}$.

Figure 7:
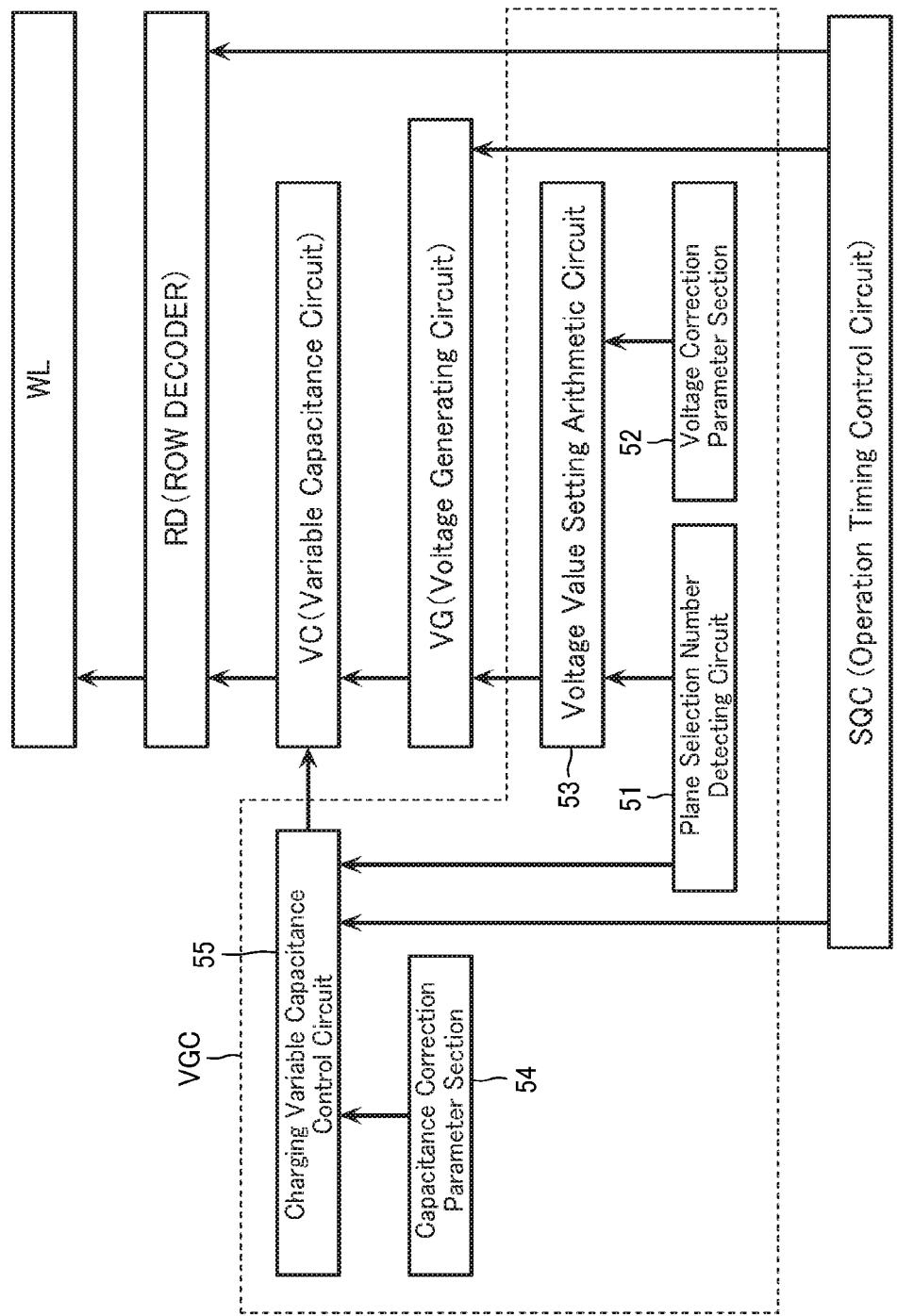
FIG. 7 is a schematic block circuit diagram showing a configuration of a voltage generation control circuit VGC and circuits related thereto.

As shown in FIG. 7, for example, the voltage generation control circuit VGC (FIG. 1) comprises a plane selection number detecting circuit 51, a voltage correction parameter section 52, a voltage value setting arithmetic circuit 53, a capacitance correction parameter section 54, and a charging variable capacitance control circuit 55.

The plane selection number detecting circuit 51 detects the number (plane number) of memory cell arrays MCA (FIG. 8) that are to undergo the write operation, by referring to the likes of address data $D_{ADD}$ latched in the address register ADR (FIG. 1). The plane selection number detecting circuit 51 may include a logic circuit such as an adder circuit connected to the address register ADR, for example.

The voltage correction parameter section 52 holds parameters for respectively adjusting each of voltage values outputted from the voltage generating units vg1, vg2, vg3, depending on the number (plane number) of memory cell arrays MCA (FIG. 8) that are to undergo the write operation. The voltage correction parameter section 52 may be the likes of a register, for example.

The voltage value setting arithmetic circuit 53 adjusts the voltage values outputted from the voltage generating units vg1, vg2, vg3 of the voltage generating circuit VG (FIG. 3), depending on the number (plane number) of memory cell arrays MCA (FIG. 8) that have been detected by the plane selection number detecting circuit 51, by referring to the parameters held in the voltage correction parameter section 52 and a control signal from the sequencer SQC. The voltage value setting arithmetic circuit 53 may output the operation voltage control signal $V_{CTRL}$ (FIG. 6), for example.

The capacitance correction parameter section 54 holds parameters for respectively adjusting capacitance values of the variable capacitance circuits VC1, VC2, VC3, depending on the number (plane number) of memory cell arrays MCA (FIG. 8) that are to undergo the write operation. The capacitance correction parameter section 54 may be the likes of a register, for example.

The charging variable capacitance control circuit 55 controls which capacitors of each of the capacitors $C_{VC11}$, $C_{VC12}$, $C_{VC13}$, $C_{VC21}$, $C_{VC22}$, $C_{VC23}$, $C_{VC31}$, $C_{VC32}$, $C_{VC33}$ of the variable capacitance circuits CV1, CV2, CV3 are to be made electrically continuous with the voltage supply lines $L_{VG1}$, $L_{VG2}$, $L_{VG3}$, depending on the number (plane number) of memory cell arrays MCA (FIG. 8) that have been detected by the plane selection number detecting circuit 51, by referring to the parameters held in the capacitance correction parameter section 54 and a control signal from the sequencer SQC. An output terminal of the charging variable capacitance control circuit 55 may be connected to the signal supply line CSEL (FIG. 3), for example.

[Circuit Configurations of Driver Circuit DRV, Word Line Decoder WLD, and Row Decoder RD]

As shown in FIG. 3, voltages supplied from the voltage generating circuit VG are supplied to a wiring $CG_S$ and a wiring $CG_U$, by the driver circuit DRV. The word line decoder WLD connects each of a plurality of wirings CG to either of the wiring $CG_S$ or the wiring $CG_U$. Each of the plurality of wirings CG is connected to each of the plurality of word lines WL in the memory block BLK representing an operation target, of the plurality of memory blocks BLK, via a transfer switch WLSW.

As shown in FIG. 3, for example, the row decoder RD comprises the transfer switch WLSW and a block decoder BLKD.

The transfer switch WLSW (FIG. 3) comprises a plurality of block decode units blkd provided correspondingly to the plurality of memory blocks BLK in the memory cell array MCA. The block decode unit blkd comprises a plurality of transistors $T_{BLK}$ provided correspondingly to the plurality of word lines WL in the memory block BLK. The transistor $T_{BLK}$ is a field effect type NMOS transistor, for example. A drain electrode of the transistor $T_{BLK}$ is connected to the word line WL. A source electrode of the transistor $T_{BLK}$ is connected to the wiring CG. The wiring CG is connected to all of the block decode units blkd in the transfer switch WLSW. A gate electrode of the transistor $T_{BLK}$ is connected to a signal supply line BLKSEL supplied from the block decoder BLKD. A plurality of the signal supply lines BLKSEL are provided correspondingly to all of the block decode units blkd. Moreover, the signal supply line BLKSEL is connected to all of the transistors $T_{BLK}$ in the block decode unit blkd.

As a result, each of the plurality of wirings CG is connected to each of the plurality of word lines WL in the memory block BLK representing the operation target, of the plurality of memory blocks BLK, via the transfer switch WLSW. That is, the transfer switch WLSW connects the plurality of wirings CG acting as global word lines to the word lines WL acting as local word lines.

In the read operation, the write operation, and so on, for example, one signal supply line BLKSEL corresponding to a block address in an unillustrated address register attains an "H" state, and other signal supply lines BLKSEL attain an "L" state. For example, the one signal supply line BLKSEL is supplied with a certain drive voltage having a positive magnitude, and the other signal supply lines BLKSEL are supplied with the ground voltage $V_{SS}$, or the like. As a result, all of the word lines WL in the one memory block BLK corresponding to this block address are electrically continuous with all of the wirings CG. Moreover, all of the word lines WL in the other memory blocks BLK attain a floating state.

The word line decoder WLD (FIG. 3) comprises a plurality of word line decode units wld provided correspondingly to the plurality of memory cells MC in the memory string MS. In the example illustrated, the word line decode unit wld comprises two transistors $T_{WLS}$, $T_{WLU}$. The transistors $T_{WLS}$, $T_{WLU}$ are field effect type NMOS transistors, for example.

A drain electrode of the transistor $T_{WLS}$ is connected to the wiring CG. A source electrode of the transistor $T_{WLS}$ is connected to the wiring $CG_S$. A gate electrode of the transistor $T_{WLS}$ is connected to a signal supply line $WLSEL_S$. A plurality of the signal supply lines $WLSEL_S$ are provided correspondingly to one of the two transistors $T_{WLS}$, $T_{WLU}$, that is, the transistor $T_{WLS}$ included in all of the word line decode units wld.

A drain electrode of the transistor $T_{WLU}$ is connected to the wiring CG. A source electrode of the transistor $T_{WLU}$ is connected to the wiring $CG_U$. A gate electrode of the transistor $T_{WLU}$ is connected to a signal supply line $WLSEL_U$. A plurality of the signal supply lines $WLSEL_U$ are provided correspondingly to the other of the two transistors $T_{WLS}$, $T_{WLU}$, that is, the transistor $T_{WLU}$ included in all of the word line decode units wld.

In the read operation, the write operation, and so on, for example, the signal supply line $WLSEL_S$ corresponding to one word line decode unit wld corresponding to a page address in an unillustrated address register attains an "H" state, and the signal supply line $WLSEL_U$ corresponding to this signal supply line $WLSEL_S$ attains an "L" state. Moreover, the signal supply lines $WLSEL_S$ corresponding to other word line decode units wld attain an "L" state, and the signal supply lines $WLSEL_U$ corresponding to these signal supply lines $WLSEL_S$ attain an "H" state. Moreover, the wiring $CG_S$ is supplied with a voltage corresponding to a selected word line WL. Moreover, the wiring $CG_U$ is supplied with a voltage corresponding to an unselected word line WL. As a result, the above-described one word line WL corresponding to the page address is supplied with the voltage corresponding to the selected word line WL. Moreover, the other word lines WL are supplied with the voltages corresponding to the unselected word lines WL.

The driver circuit DRV (FIG. 3) comprises a plurality of transistors $T_{DRV1}$, $T_{DRV2}$, $T_{DRV3}$, $T_{DRV4}$, $T_{DRV5}$, $T_{DRV6}$, for example. These transistors $T_{DRV1}$, $T_{DRV2}$, $T_{DRV3}$, $T_{DRV4}$, $T_{DRV5}$, $T_{DRV6}$ are field effect type NMOS transistors, for example.

Drain electrodes of the transistors $T_{DRV1}$, $T_{DRV2}$, $T_{DRV3}$, $T_{DRV4}$ are connected to the wiring $CG_S$. Drain electrodes of the transistors $T_{DRV5}$, $T_{DRV6}$ are connected to the wiring $CG_U$. A source electrode of the transistor $T_{DRV1}$ is connected to the voltage supply line $L_{VG1}$, source electrodes of the transistors $T_{DRV2}$, $T_{DRV5}$ are connected to the voltage supply line $L_{VG2}$, and a source electrode of the transistor $T_{DRV3}$ is connected to the voltage supply line $L_{VG3}$. Source electrodes of the transistors $T_{DRV4}$, $T_{DRV6}$ are connected to the voltage supply line $L_P$. This voltage supply line $L_P$ is connected with a bonding pad electrode P supplied with the ground voltage $V_{SS}$. Gate electrodes of the transistors $T_{DRV1}$, $T_{DRV2}$, $T_{DRV3}$, $T_{DRV4}$, $T_{DRV5}$, $T_{DRV6}$ are connected to the sequencer SQC (FIG. 1) via a signal supply line VSEL. The sequencer SQC performs ON/OFF control of the transistors $T_{DRV1}$, $T_{DRV2}$, $T_{DRV3}$, $T_{DRV4}$, $T_{DRV5}$, $T_{DRV6}$, Via the signal supply line VSEL.

The block decoder BLKD (FIG. 3) sequentially refers to a row address RA of the address register ADR (FIG. 1) and controls a voltage of the signal supply line BLKSEL to an "H" state or an "L" state, according to a control signal from the sequencer SQC (FIG. 1), for example.

Note that in the example of FIG. 3, the row decoder RD has the block decode units blkd provided one each to each one of the memory blocks BLK. However, this configuration can be appropriately changed. For example, the block decode units blkd may be provided one each to every two or more of the memory blocks BLK.

[Circuit Configuration of Sense Amplifier Module SAM]

The sense amplifier module SAM (FIG. 1) comprises a plurality of sense amplifiers that are connected to a plurality of the bit lines BL, for example. The sense amplifier comprises: a sense circuit connected to the bit line BL; a voltage transfer circuit connected to the bit line BL; and a latch circuit connected to the sense circuit and the voltage transfer circuit. The sense circuit comprises: a sense transistor that attains an "ON" state depending on a voltage or current of the bit line BL; and a wiring which is charged/discharged depending on an ON/OFF state of the sense transistor. The latch circuit latches data of "1" or "0" depending on a voltage of this wiring. The voltage transfer circuit causes the bit line BL to be electrically continuous with either of the two voltage supply lines depending on the data latched in this latch circuit.

[Circuit Configuration of Cache Memory CM]

The cache memory CM (FIG. 1) comprises a plurality of latch circuits that are connected to the latch circuits within the sense amplifier module SAM via a wiring DBUS. Data DAT included in these plurality of latch circuits is sequentially transferred to the sense amplifier module SAM or the input/output control circuit I/O.

Moreover, the cache memory CM is connected with an unillustrated decode circuit and an unillustrated switch circuit. The decode circuit decodes a column address CA latched in the address register ADR (FIG. 1). The switch circuit causes the latch circuit corresponding to the column address CA to be electrically continuous with a bus DB (FIG. 1), depending on an output signal of the decode circuit.

[Circuit Configuration of Sequencer SQC]

The sequencer SQC (FIG. 1) outputs an internal control signal to the row decoder RD, the sense amplifier module SAM, the driver circuit DRV, the word line decoder WLD, the voltage generating circuit VG, and the voltage generation control circuit VGC, according to command data $D_{CMD}$ latched in the command register CMR. In addition, the sequencer SQC appropriately outputs to the status register STR status data $D_{ST}$ indicating a state of the sequencer SQC itself.

Moreover, the sequencer SQC generates a ready/busy signal, and outputs the ready/busy signal to a terminal RY/BY. In a period when the terminal RY/BY is in an "L" state (a busy period), access to the memory die MD is basically prohibited. Moreover, in a period when the terminal RY/BY is in an "H" state (a ready period), access to the memory die MD is allowed. A signal outputted from the terminal RY/BY is sometimes referred to as a ready/busy signal RY/BY.

[Circuit Configuration of Input/Output Control Circuit I/O]

The input/output control circuit I/O (FIG. 1) comprises: data signal input/output terminals DQ0-DQ7; toggle signal input/output terminals DQS, /DQS; and an input circuit such as a comparator and output circuit such as an OCD (Off Chip Driver) circuit that are connected to the data signal input/output terminals DQ0-DQ7. In addition, the input/output control circuit I/O comprises: a shift register connected to these input circuit and output circuit; and a buffer circuit. The input circuit, the output circuit, the shift register, and the buffer circuit are each supplied with a power supply voltage $V_{CCQ}$ and the ground voltage $V_{SS}$. Data inputted via the data signal input/output terminals DQ0-DQ7 is outputted to the cache memory CM, the address register ADR, or the command register CMR from the buffer circuit, depending on an internal control signal from the logic circuit CTR. Moreover, data outputted via the data signal input/output terminals DQ0-DQ7 is inputted to the buffer circuit from the cache memory CM or the status register STR, depending on an internal control signal from the logic circuit CTR.

[Circuit Configuration of Logic Circuit CTR]

The logic circuit CTR (FIG. 1) receives an external control signal via external control terminals /CEn, CLE, ALE, /WE, RE, /RE, and outputs an internal control signal to the input/output control circuit I/O depending on this external control signal.

[Structure of Memory Die MD]

Figure 8:
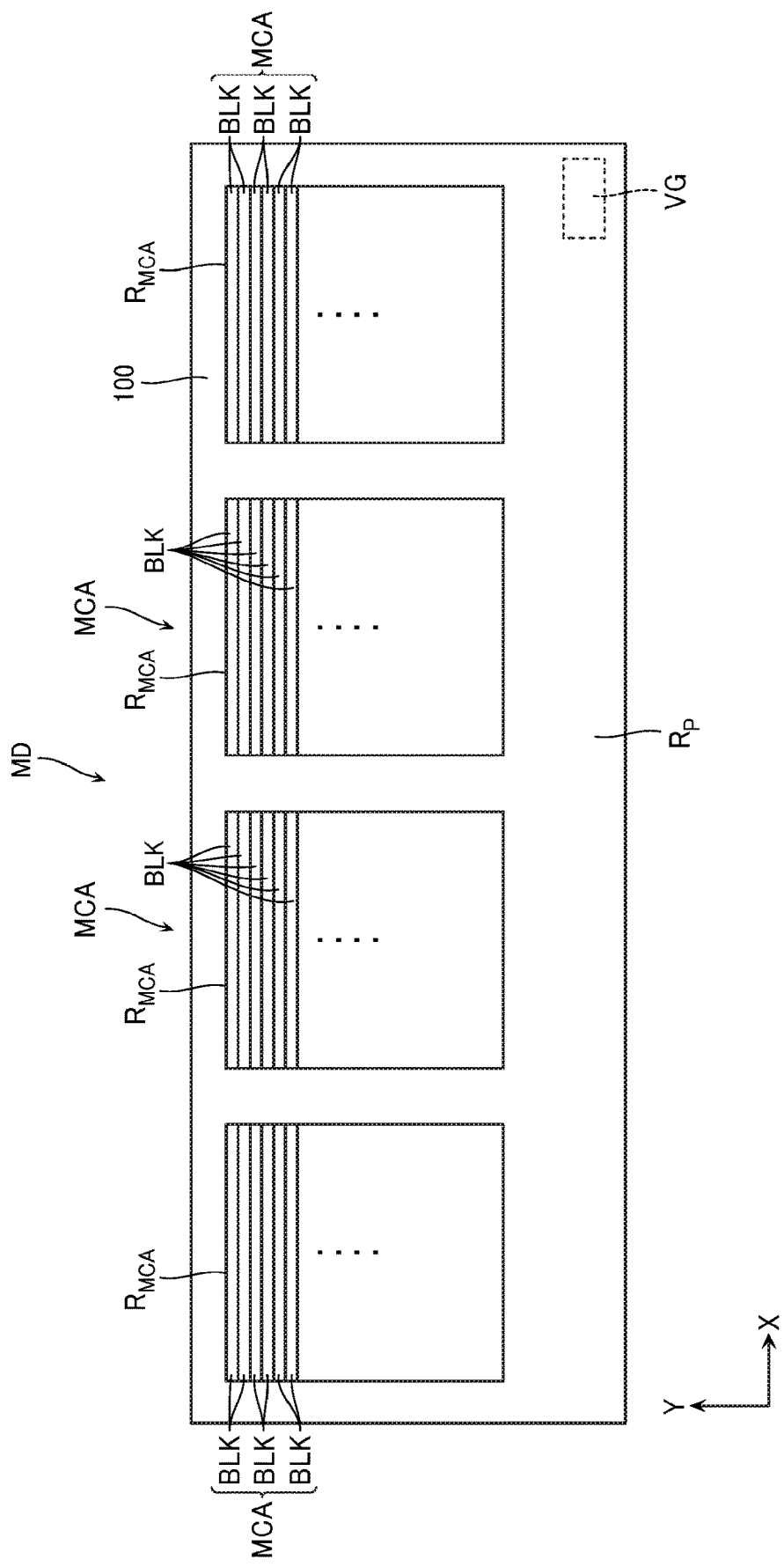
FIG. 8 is a schematic plan view of the memory die MD.
Figure 9:
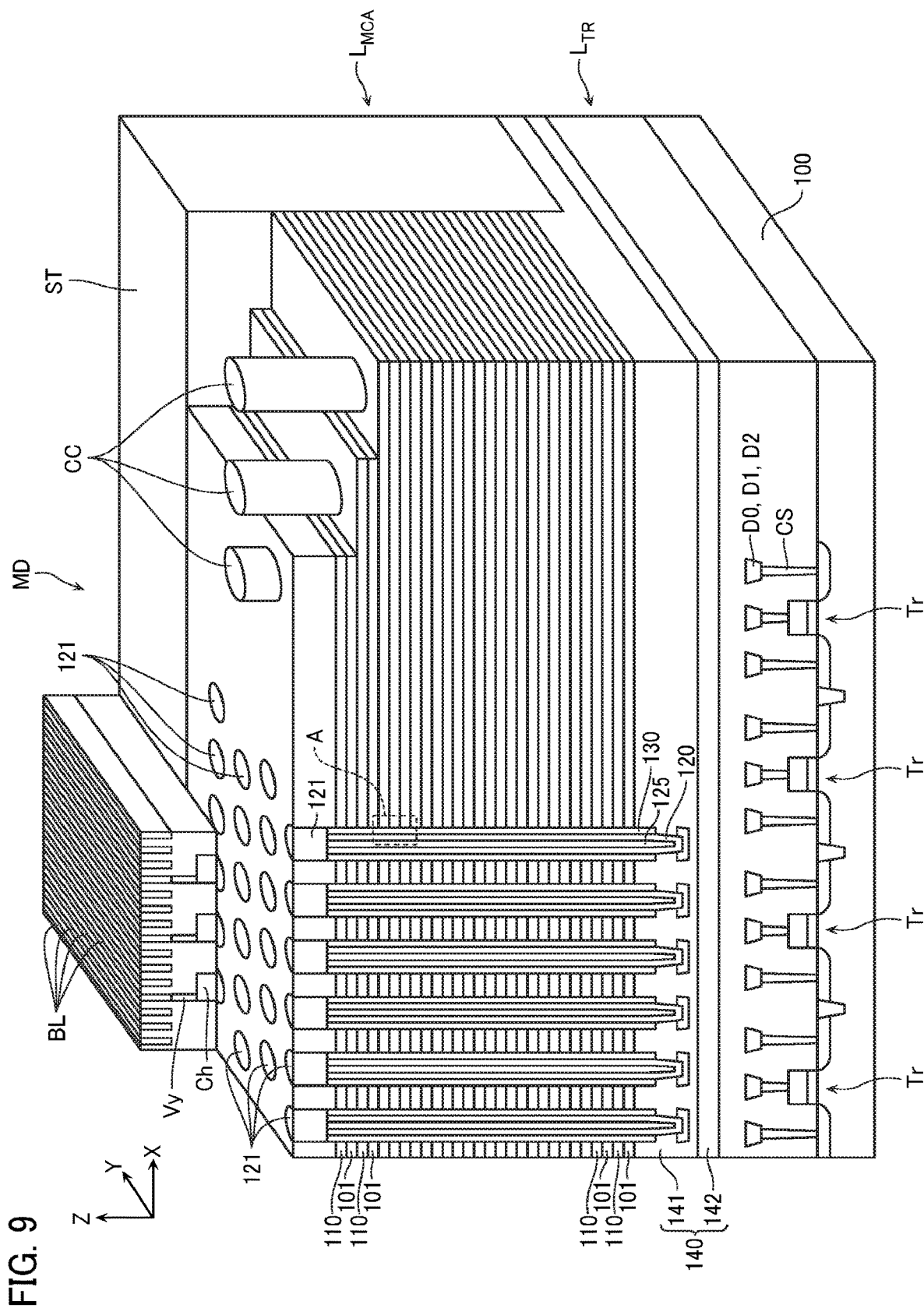
FIG. 9 is a schematic perspective view showing a configuration of part of the memory die MD.
Figure 10:
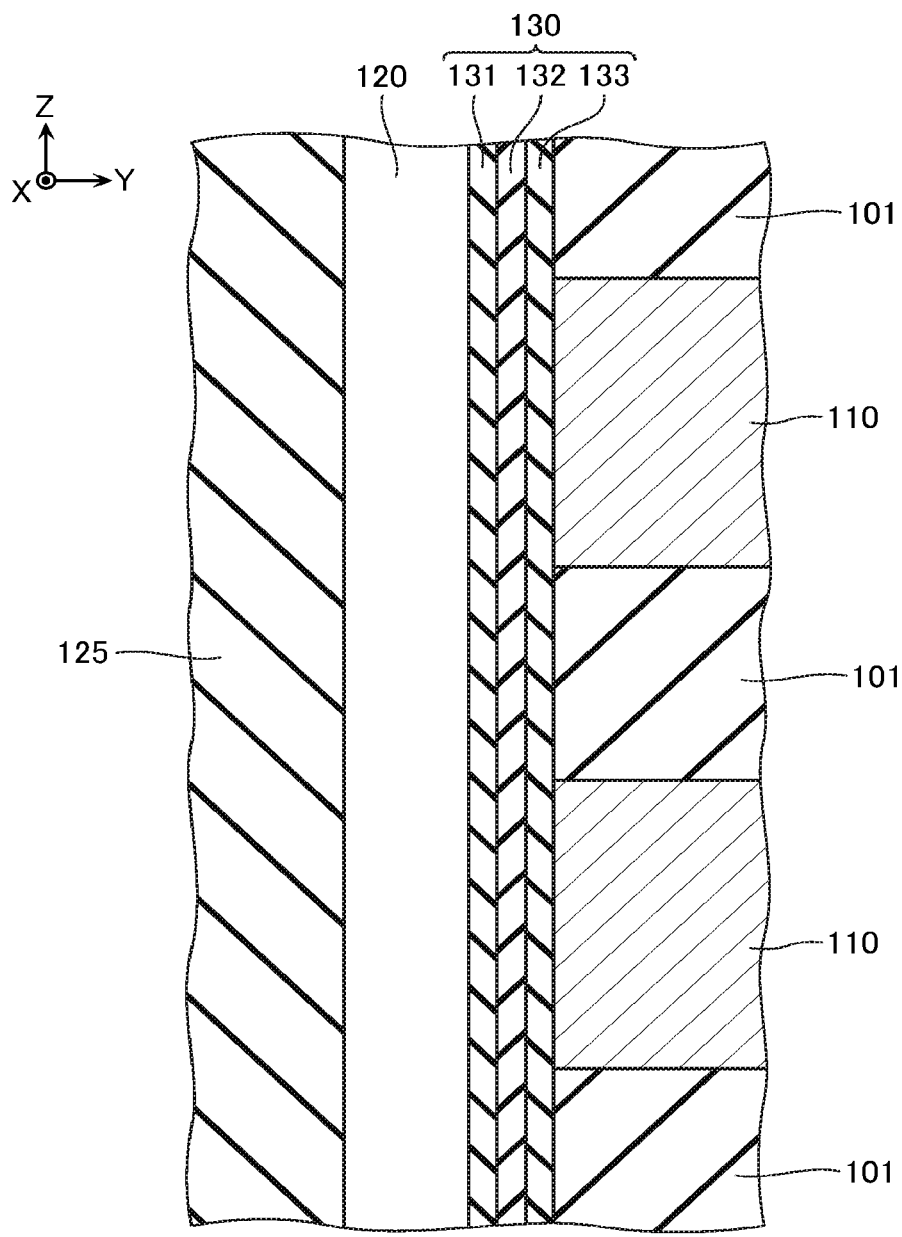
FIG. 10 is a schematic enlarged view of the portion indicated by A in FIG. 9.

FIG. 8 is a schematic plan view of the memory die MD. FIG. 9 is a schematic perspective view showing a configuration of part of the memory die MD. FIG. 10 is a schematic enlarged view of the portion indicated by A in FIG. 9.

As shown in FIG. 8, the memory die MD comprises a semiconductor substrate 100. In the example illustrated, the semiconductor substrate 100 is provided with four memory cell array regions $R_{MCA}$ that are aligned in the X direction. The memory cell array regions $R_{MCA}$ are each provided with the memory cell array MCA (FIGS. 1 and 2).

Moreover, in an end portion in the Y direction of the semiconductor substrate 100, a peripheral region $R_P$ is provided. The peripheral region $R_P$ extends in the X direction along the end portion in the Y direction of the semiconductor substrate 100. This peripheral region $R_P$ is provided with part of the peripheral circuit PC. The voltage generating circuit VG (FIG. 1), of the peripheral circuit PC is disposed at a position on one end side in the X direction, separated from the memory cell array region $R_{MCA}$, for example.

Moreover, as shown in FIG. 9, the memory die MD comprises: the semiconductor substrate 100; a transistor layer $L_{TR}$ provided on the semiconductor substrate 100; and a memory cell array layer $L_{MCA}$ provided above the transistor layer $L_{TR}$.

The semiconductor substrate 100 shown in FIGS. 8 and 9 is a semiconductor substrate configured from P type silicon (Si) including a P type impurity such as boron (B), for example. A surface of the semiconductor substrate 100 is provided with, for example: an N type well region including an N type impurity such as phosphorus (P); a P type well region including a P type impurity such as boron (B); a semiconductor substrate region where the N type well region and the P type well region are not provided; and an insulating region. The N type well region, the P type well region, and the semiconductor substrate region each function as part of a plurality of transistors Tr and a plurality of capacitors, and so on, configuring the peripheral circuit PC.

As shown in FIG. 9, the transistor layer $L_{TR}$ is provided with: the plurality of transistors Tr configuring the peripheral circuit PC (FIG. 1); and contacts CS and wiring layers D0, D1, D2 connected to these plurality of transistors Tr. The transistor Tr is a field effect type transistor utilizing the surface of the semiconductor substrate 100 as its channel region, for example. The contact CS extends in the Z direction, and, at its lower end, is connected to an upper surface of the semiconductor substrate 100, and so on. The contact CS may include, for example, a stacked film of a barrier conductive film of the likes of titanium nitride (TiN) and a metal film of the likes of tungsten (W), or the like. A plurality of wirings included in the wiring layers D0, D1, D2 are electrically connected to at least one of configurations in the memory cell array MCA and configurations in the peripheral circuit PC. The plurality of wirings included in the wiring layers D0, D1, D2 may include, for example, a stacked film of a barrier conductive film of the likes of titanium nitride (TiN) and a metal film of the likes of tungsten (W), or the like.

As shown in FIG. 8, the memory cell array region $R_{MCA}$ of the memory cell array layer $L_{MCA}$ (FIG. 9) is provided with a plurality of the memory blocks BLK aligned in the Y direction. As shown in FIG. 9, for example, the memory block BLK comprises: a plurality of conductive layers 110 aligned in the Z direction; a plurality of semiconductor layers 120 extending in the Z direction; a plurality of gate insulating films 130 respectively provided between the plurality of conductive layers 110 and the plurality of semiconductor layers 120; and a conductive layer 140 provided below these configurations. Moreover, an inter-block structure ST of the likes of silicon oxide ($SiO_2$) is provided between two of the memory blocks BLK adjacent in the Y direction.

The conductive layer 110 is a substantially plate-like conductive layer extending in the X direction. The conductive layer 110 may include a stacked film of a barrier conductive film of the likes of titanium nitride (TiN) and a metal film of the likes of tungsten (W), or the like. Moreover, the conductive layer 110 may include the likes of polycrystalline silicon including an impurity such as phosphorus (P) or boron (B), for example. An insulating layer 101 of the likes of silicon oxide ($SiO_2$) is respectively provided between two conductive layers 110 adjacent in the Z direction among the plurality of conductive layers 110 aligned in the Z direction.

Moreover, one or a plurality of the conductive layers 110 positioned in a lowermost layer, of the plurality of conductive layers 110 function as the source side select gate line SGS (FIG. 2) and as the gate electrodes of the plurality of source side select transistors STS (FIG. 2) connected to this source side select gate line SGS.

Moreover, the plurality of conductive layers 110 positioned more upwardly than these lowermost layer-positioned conductive layers 110 function as the word lines WL (FIG. 2) and as the gate electrodes of the pluralities of memory cells MC (FIG. 2) connected to these word lines WL. These plurality of conductive layers 110 are each electrically independent every memory block BLK.

Moreover, one or a plurality of the conductive layers 110 positioned more upwardly than these word line WL-functioning conductive layers 110 function as the drain side select gate line SGD (FIG. 2) and as the gate electrodes of the plurality of drain side select transistors STD (FIG. 2) connected to this drain side select gate line SGD.

Note that in end portions in the X direction of these plurality of conductive layers 110, connecting portions with a plurality of contacts CC are provided. These plurality of contacts CC extend in the Z direction, and, at their lower ends, are connected to the conductive layers 110. The contact CC may include, for example, a stacked film of a barrier conductive film of the likes of titanium nitride (TiN) and a metal film of the likes of tungsten (W), or the like.

The semiconductor layers 120 are aligned in a certain pattern in the X direction and the Y direction. The semiconductor layer 120 functions as the channel regions of the plurality of memory cells MC and the select transistors (STD, STS, STSb) included in one memory string MS (FIG. 2). The semiconductor layer 120 is a semiconductor layer of the likes of polycrystalline silicon (Si), for example. The semiconductor layer 120 has a substantially bottomed cylindrical shape, and has its central portion provided with an insulating layer 125 of the likes of silicon oxide, for example. Moreover, an outer peripheral surface of the semiconductor layer 120 is surrounded by respective ones of the conductive layers 110, and faces the conductive layers 110.

An upper end portion of the semiconductor layer 120 is provided with an impurity region 121 that includes an N type impurity of the likes of phosphorus (P). The impurity region 121 is connected to the bit line BL that extends in the Y direction, via a contact Ch and a contact Vy.

The gate insulating film 130 has a substantially cylindrical shape covering the outer peripheral surface of the semiconductor layer 120.

As shown in FIG. 10, for example, the gate insulating film 130 comprises a tunnel insulating film 131, a charge accumulating film 132, and a block insulating film 133 that are stacked between the semiconductor layer 120 and the conductive layers 110. The tunnel insulating film 131 and the block insulating film 133 are insulating films of the likes of silicon oxide ($SiO_2$), for example. The charge accumulating film 132 is a film capable of accumulating a charge, of the likes of silicon nitride ($Si_3N_4$), for example. The tunnel insulating film 131, the charge accumulating film 132, and the block insulating film 133 have substantially cylindrical shapes, and extend in the Z direction along the outer peripheral surface of the semiconductor layer 120.

Note that FIG. 10 shows an example where the gate insulating film 130 comprises the charge accumulating film 132 of the likes of silicon nitride. However, the gate insulating film 130 may comprise a floating gate of the likes of polycrystalline silicon including an N type or P type impurity, for example.

As shown in FIG. 9, the conductive layer 140 comprises: a conductive layer 141 connected to a lower end portion of the semiconductor layer 120; and a conductive layer 142 provided on a lower surface of the conductive layer 141. The conductive layer 141 includes a conductive semiconductor such as polysilicon that includes an N type impurity of the likes of phosphorus (P), for example. The conductive layer 142 may include a conductive semiconductor such as polysilicon that includes an N type impurity of the likes of phosphorus (P), may include a metal such as tungsten (W), or may include the likes of a silicide, for example.

[Write Operation]

Next, the write operation of the memory die MD according to the first embodiment will be simply described with reference to FIGS. 11 and 12.

Note that in the description below, the word line WL representing a target of the write operation will sometimes be referred to as a selected word line $WL_S$, and the word line WL other than the selected word line $WL_S$ will sometimes be referred to as an unselected word line $WL_U$. Moreover, in the description below, there will be described an example where those memory cells MC connected to the selected word line $WL_S$, of the plurality of memory cells MC included in the string unit SU representing a target of the write operation (hereafter, sometimes referred to as "selected memory cells MC") are executed with the write operation.

The write operation includes a program operation and a verify operation.

Figure 11:
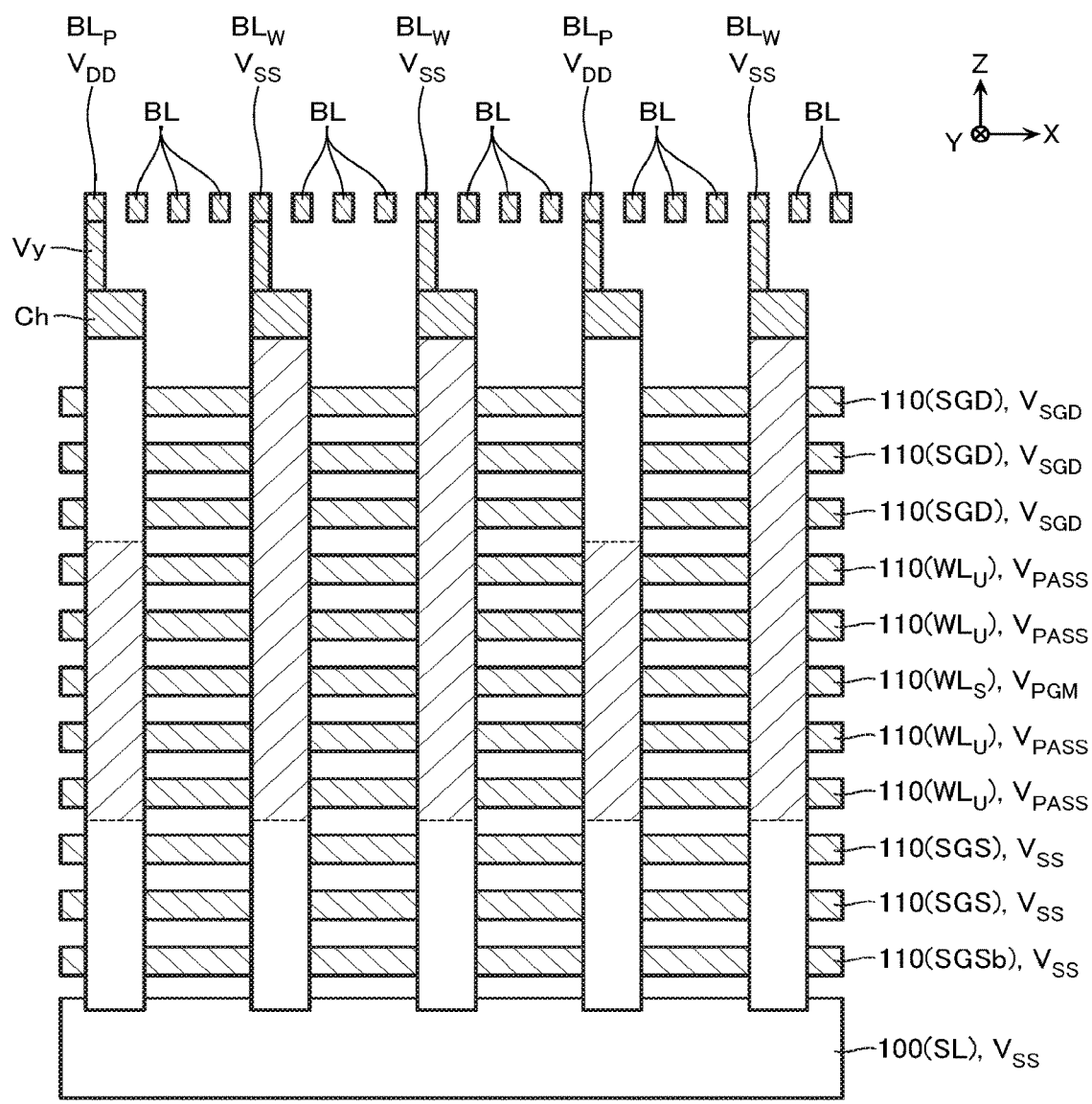
FIG. 11 is a schematic cross-sectional view for explaining a program operation included in a write operation.

FIG. 11 is a schematic cross-sectional view for explaining the program operation. The program operation is an operation in which the selected word line $WL_S$ is supplied with the program voltage $V_{PGM}$ to increase the threshold voltage of the memory cells MC.

In the program operation, for example, the bit lines $BL_W$ connected to the memory cells MC that are to undergo adjustment of their threshold voltage, of the plurality of selected memory cells MC (hereafter, sometimes referred to as "write memory cells MC") are supplied with the ground voltage $V_{SS}$, and the bit lines $BL_P$ connected to the memory cells MC that are not to undergo adjustment of their threshold voltage, of the plurality of selected memory cells MC (hereafter, sometimes referred to as "prohibit memory cells MC") are supplied with a voltage $V_{DD}$.

In the program operation, the selected word line $WL_S$ and the unselected word lines $WL_U$ are supplied with a write pass voltage $V_{PASS}$. Moreover, the drain side select gate lines SGD are supplied with a voltage $V_{SGD}$. The write pass voltage $V_{PASS}$ has a magnitude of a degree that the memory cell MC will attain an ON state regardless of the threshold voltage of the memory cell MC. The voltage $V_{SGD}$ has a magnitude of a degree that the drain side select transistor STD will attain an ON state or an OFF state depending on a voltage of the bit line BL.

In the program operation, the selected word line $WL_S$ is supplied with the program voltage $V_{PGM}$. The program voltage $V_{PGM}$ is larger than the write pass voltage $V_{PASS}$.

As shown in FIG. 11, for example, the bit lines $BL_W$ are supplied with the ground voltage $V_{SS}$. For example, the ground voltage $V_{SS}$ supplied to the bit lines $BL_W$ is lower than the voltage $V_{SGD}$ supplied to the drain side select gate lines SGD. More specifically, a voltage difference of the voltage $V_{SGD}$ and the ground voltage $V_{SS}$ is larger than a threshold of the drain side select transistor STD. Therefore, the drain side select transistor STD attains an ON state, and the channel of the semiconductor layer 120 connected to the bit line $BL_W$ is supplied with the ground voltage $V_{SS}$. A comparatively large electric field is generated between the channel of the semiconductor layer 120 connected to the bit line $BL_W$ and the selected word line $WL_S$. As a result, electrons in the channel of the semiconductor layer 120 tunnel inside the charge accumulating film 132 (FIG. 10) via the tunnel insulating film 131 (FIG. 10). As a result, the threshold voltage of the write memory cell MC increases. Note that the voltage supplied to the bit line $BL_W$ is not limited to the ground voltage $V_{SS}$. For example, a voltage a little higher than the ground voltage $V_{SS}$ may be supplied to the bit line $BL_W$.

On the other hand, the bit lines $BL_P$ are supplied with the voltage $V_{DD}$. For example, the voltage $V_{DD}$ supplied to the bit lines $BL_P$ is higher than the voltage $V_{SGD}$ supplied to the drain side select gate lines SGD. More specifically, a voltage difference of the voltage $V_{SGD}$ and the voltage $V_{DD}$ is smaller than the threshold of the drain side select transistor STD. Therefore, the drain side select transistor STD attains an OFF state, and the channel of the semiconductor layer 120 connected to the bit line $BL_P$ attains an electrically floating state. Then, when the selected word line $WL_S$ and the unselected word lines $WL_U$ are supplied with the write pass voltage $V_{PASS}$, a potential of the channel of the semiconductor layer 120 connected to the bit line $BL_P$ rises to about the write pass voltage $V_{PASS}$, for example, due to capacitive coupling with the selected word line $WL_S$ and the unselected word lines $WL_U$. Therefore, an electric field generated between the channel of the semiconductor layer 120 connected to the bit line $BL_P$ and the selected word line $WL_S$ is smaller than the above-described electric field generated between the channel of the semiconductor layer 120 connected to the bit line $BL_W$ and the selected word line $WL_S$. Hence, electrons in the channel of the semiconductor layer 120 do not tunnel inside the charge accumulating film 132 (FIG. 10). Hence, the threshold voltage of the prohibit memory cell MC does not increase (or increases only to a substantively ignorable extent).

Figure 12:
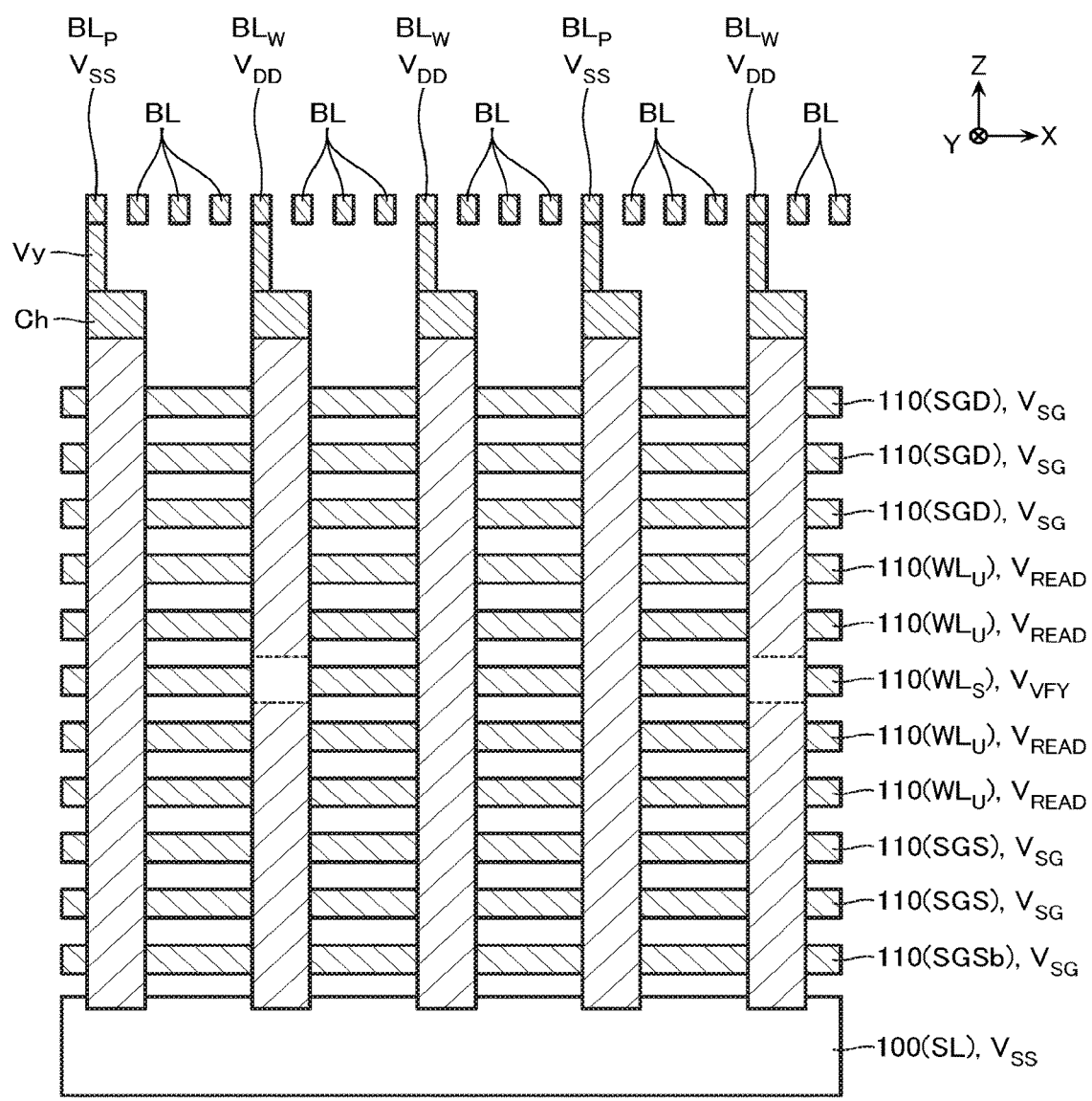
FIG. 12 is a schematic cross-sectional view for explaining a verify operation included in the write operation.

FIG. 12 is a schematic cross-sectional view for explaining the verify operation. The verify operation is an operation in which the selected word line $WL_S$ is supplied with a verify voltage $V_{VFY}$ to confirm whether the threshold voltage of the memory cell MC has reached a target value, or not. That is, the verify operation is a read operation performed as part of the write operation in order to confirm whether the threshold voltage of the memory cell MC has reached the target value as a result of the program operation, or not.

In the verify operation, for example, the bit lines BL undergo charging, and so on. For example, the bit lines $BL_W$ connected to the write memory cells MC (verify target memory cells MC) are supplied with the voltage $V_{DD}$, and the bit lines $BL_P$ connected to the prohibit memory cells MC (non-verify target memory cells MC) are supplied with the ground voltage $V_{SS}$.

In the verify operation, the unselected word lines $WL_U$ are supplied with a read pass voltage $V_{READ}$. Moreover, the select gate lines (SGD, SGS, SGSb) are supplied with a voltage $V_{SG}$. The read pass voltage $V_{READ}$ has a magnitude of a degree that the memory cell MC will attain an ON state regardless of the threshold voltage of the memory cell MC. The read pass voltage $V_{READ}$ may be about the same as the write pass voltage $V_{PASS}$, or may be smaller than the write pass voltage $V_{PASS}$. The voltage $V_{SG}$ has a magnitude of a degree that the drain side select transistor STD will attain an ON state, regardless of the voltage of the bit line BL. The voltage $V_{SG}$ is larger than the voltage $V_{SGD}$.

In the verify operation, the selected word line $WL_S$ is supplied with the verify voltage $V_{VFY}$. The verify voltage $V_{VFY}$ has a magnitude of a degree that the memory cell MC will attain an ON state or an OFF state depending on the threshold voltage of the memory cell MC. The verify voltage $V_{VFY}$ is smaller than the read pass voltage $V_{READ}$. As a result, some of the selected memory cells MC attain an ON state, and the remaining selected memory cells MC attain an OFF state.

In the verify operation, a sense operation is executed by the sense amplifier module SAM (FIG. 1). For example, an ON state/OFF state of the memory cell MC connected to the bit line BL is detected based on a current value of the bit line BL, and acquired as data indicating the state of the memory cell MC. At this time, the data indicating an ON state/OFF state of the memory cell MC, and so on, may be latched in the latch circuit within the sense amplifier module SAM.

Figure 13:
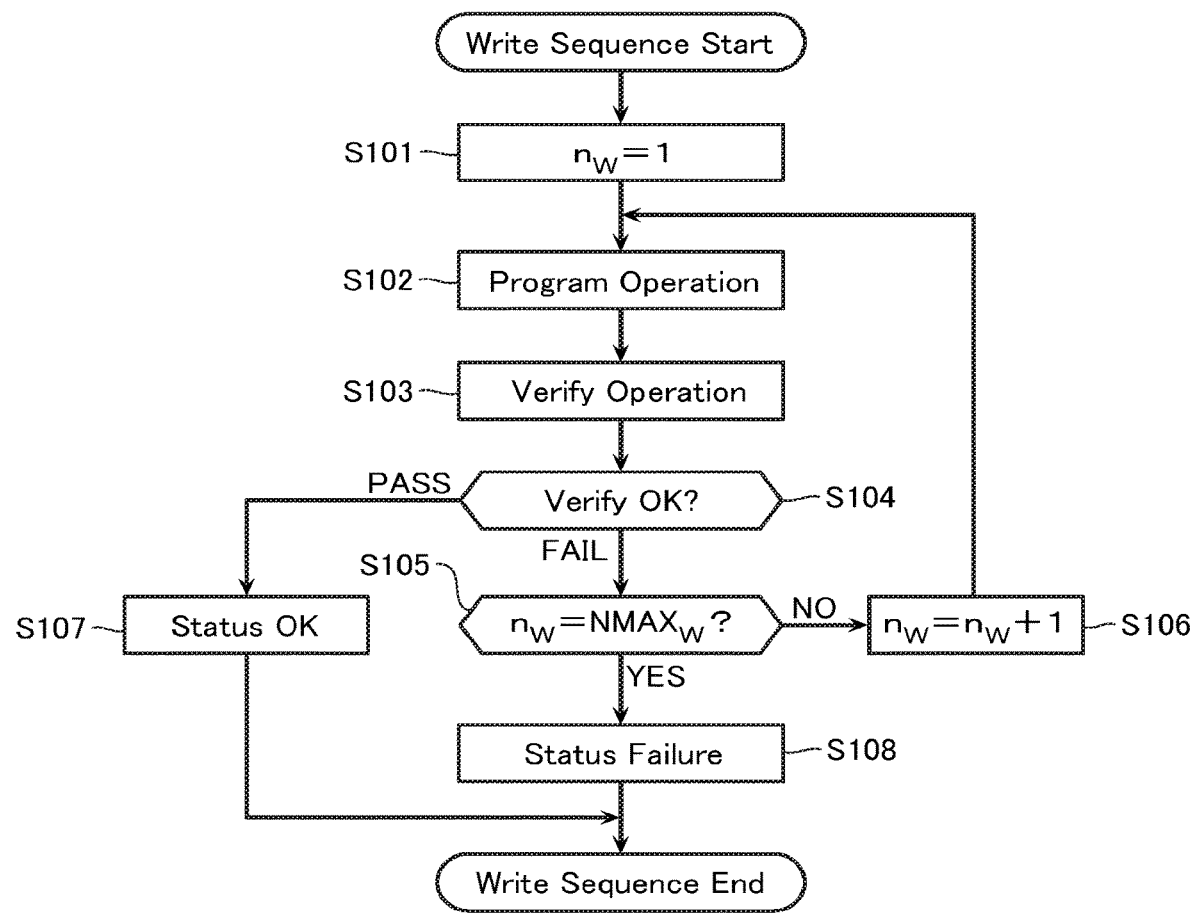
FIG. 13 is a flowchart for explaining the write operation.

FIG. 13 is a flowchart for explaining the write operation.

In step S101, a loop count $n_W$ is set to 1. The loop count $n_W$ is a variable indicating the number-of-times of a write loop. Moreover, the latch circuit within the sense amplifier module SAM (FIG. 1) is latched with user data to be written to the memory cells MC, for example.

In step S102, the program operation is executed.

In step S103, the verify operation is executed.

In step S104, a result of the verify operation is judged. For example, in such cases as when the number of memory cells MC whose threshold value has not reached the target value is a certain number or more, there is judged to have been a verify fail, and operation proceeds to step S105. On the other hand, in such cases as when the number of memory cells MC whose threshold value has not reached the target value is less than the certain number, there is judged to have been a verify pass, and operation proceeds to step S107.

In step S105, it is judged whether the loop count $n_W$ has reached a certain number-of-times $NMAX_W$, or not. If $NMAX_W$ has not been reached, then operation proceeds to step S106. If $NMAX_W$ has been reached, then operation proceeds to step S108.

In step S106, the loop count $n_W$ is increased by 1, whereupon operation proceeds to step S102. Moreover, in step S106, a certain voltage $\Delta V$ is added to the program voltage $V_{PGM}$, for example. Hence, the program voltage $V_{PGM}$ increases along with increase in the loop count $n_W$.

In step S107, status data to the effect that the write operation has ended normally is stored in the status register STR (FIG. 1), and the write operation is ended.

In step S108, status data to the effect that the write operation has not ended normally is stored in the status register STR (FIG. 1), and the write operation is ended.

Figure 14:
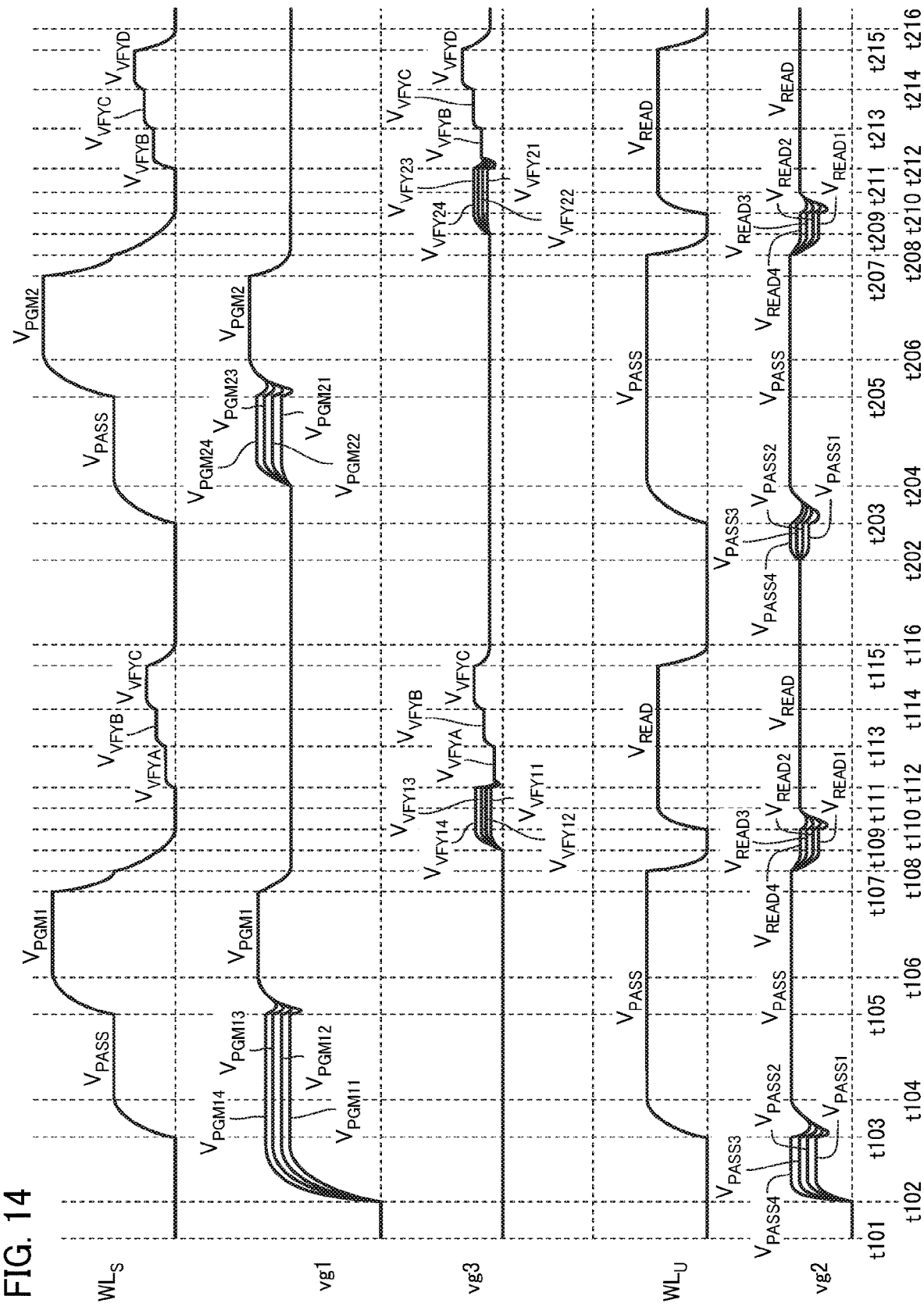
FIG. 14 is a waveform chart for explaining the write operation.

FIG. 14 is a schematic waveform chart for explaining the write operation. FIG. 14 illustrates: a voltage of the selected word line $WL_S$; an output voltage of the voltage generating unit vg1 outputting the program voltage $V_{PGM}$; an output voltage of the voltage generating unit vg3 outputting the verify voltage $V_{VFY}$; a voltage of the unselected word lines $WL_U$; and an output voltage of the voltage generating unit vg2 outputting the write pass voltage $V_{PASS}$ and the read pass voltage $V_{READ}$.

Note that in the write operation shown in FIG. 14, a connection state of wirings due to the row decoder RD and word line decoder WLD (FIG. 3) is as follows.

(a) Due to the block decoder BLKD and transfer switch WLSW of the row decoder RD (FIG. 3), all of the word lines WL in one memory block BLK corresponding to the block address are electrically continuous with all of the wirings CG.

(b) Due to the word line decoder WLD (FIG. 3), the selected word line $WL_S$ is electrically continuous with the wiring $CG_S$, and the unselected word lines $WL_U$ are electrically continuous with the wiring $CG_U$.

Moreover, in the write operation shown in FIG. 14, as previously mentioned, the following control is performed by the voltage generating circuit VG (FIG. 3) and the voltage generation control circuit VGC (FIGS. 1 and 3).

(c) Adjustment of the output voltages of the voltage generating units vg1, vg2, vg3.

(d) ON/OFF control of the transistors $T_{VC11}$, $T_{VC12}$, $T_{VC13}$, $T_{VC21}$, $T_{VC22}$, $T_{VC23}$, $T_{VC31}$, $T_{VC32}$, $T_{VC33}$ of the variable capacitance circuits VC1, VC2, VC3.

Moreover, in the write operation shown in FIG. 14, the following control is performed by the driver circuit DRV (FIG. 3) and the sequencer SQC (FIG. 1).

(e) ON/OFF control of the transistors $T_{DRV1}$, $T_{DRV2}$, $T_{DRV3}$, $T_{DRV4}$, $T_{DRV5}$, $T_{DRV6}$.

At timing t101 of FIG. 14, the transistors $T_{DRV4}$, $T_{DRV6}$ of the driver circuit DRV (FIG. 3) are set to ON, and the transistors $T_{DRV1}$, $T_{DRV2}$, $T_{DRV3}$, $T_{DRV5}$ of the driver circuit DRV (FIG. 3) are set to OFF. Therefore, the selected word line $WL_S$ and the unselected word lines $WL_U$ are electrically continuous with the bonding pad electrode P supplied with the ground voltage $V_{SS}$, via the voltage supply line $L_P$. Hence, voltages of the selected word line $WL_S$ and the unselected word lines $WL_U$ are about the ground voltage $V_{SS}$. Moreover, the output voltages of the voltage generating units vg1, vg2, vg3 are about the ground voltage $V_{SS}$.

At timing t102, the output voltage of the voltage generating unit vg1 starts to rise toward any one of program preparation voltages $V_{PGM11}$, $V_{PGM12}$, $V_{PGM13}$, $V_{RGM14}$, depending on the write plane number, and, at a timepoint earlier than timing t103, reaches the any one of these program preparation voltages $V_{PGM11}$, $V_{PGM12}$, $V_{PGM13}$, $V_{PGM14}$.

For example, when the number of memory cell arrays MCA to undergo the write operation (hereafter, referred to as "write plane number") is 4, the output voltage of the voltage generating unit vg1 rises toward the program preparation voltage $V_{PGM14}$ When the write plane number is 3, the output voltage of the voltage generating unit vg1 rises toward the program preparation voltage $V_{PGM13}$ which has a smaller voltage value than the program preparation voltage $V_{PGM14}$ When the write plane number is 2, the output voltage of the voltage generating unit vg1 rises toward the program preparation voltage $V_{PGM12}$ which has a smaller voltage value than the program preparation voltage $V_{PGM13}$ When the write plane number is 1, the output voltage of the voltage generating unit vg1 rises toward the program preparation voltage $V_{PGM11}$ which has a smaller voltage value than the program preparation voltage $V_{PGM12}$ Note that the program preparation voltage $V_{PGM14}$ has a slightly lower voltage value than a program voltage $V_{PGM1}$ For example, the program preparation voltage $V_{PGM14}$ has a voltage value which is about 90% that of the program voltage $V_{PGM1}$.

Moreover, at timing t102, ON/OFF states of the transistors $T_{VC11}$, $T_{VC12}$, $T_{VC13}$ of the variable capacitance circuit VC1 are controlled depending on the write plane number.

For example, when the write plane number is 4, for example, the transistors $T_{VC11}$, $T_{VC12}$, $T_{VC13}$ become ON. As a result, the capacitors $C_{VC11}$, $C_{VC12}$, $C_{VC13}$ are charged by the voltage generating unit vg1. When the write plane number is 3, for example, the transistors $T_{VC11}$, $T_{VC12}$ become ON, and the transistor $T_{VC13}$ becomes OFF. As a result, the capacitors $C_{VC11}$, $C_{VC12}$ are charged by the voltage generating unit vg1. When the write plane number is 2, for example, the transistors $T_{VC12}$, $T_{VC13}$ become ON, and the transistor $T_{VC11}$ becomes OFF. As a result, the capacitors $C_{VC12}$, $C_{VC13}$ are charged by the voltage generating unit vg1. Note that a combined capacitance of the capacitors $C_{VC12}$, $C_{VC13}$ is smaller than a combined capacitance of the capacitors $C_{VC11}$, $C_{VC12}$. When the write plane number is 1, for example, the transistor $T_{VC13}$ becomes ON, and the transistors $T_{VC11}$, $T_{VC12}$ become OFF. As a result, the capacitor $C_{VC13}$ is charged by the voltage generating unit vg1.

Moreover, at timing t102, the output voltage of the voltage generating unit vg2 starts to rise toward any one of write pass preparation voltages $V_{PASS1}$, $V_{PASS2}$, $V_{PASS3}$, $V_{PASS4}$, depending on the write plane number, and, at a timepoint earlier than timing t103, reaches the any one of these write pass preparation voltages $V_{PASS1}$, $V_{PASS2}$, $V_{PASS3}$, $V_{PASS4}$.

For example, when the write plane number is 4, the output voltage of the voltage generating unit vg2 rises toward the write pass preparation voltage $V_{PASS4}$. When the write plane number is 3, the output voltage of the voltage generating unit vg2 rises toward the write pass preparation voltage $V_{PASS3}$ which has a smaller voltage value than the write pass preparation voltage $V_{PASS4}$. When the write plane number is 2, the output voltage of the voltage generating unit vg2 rises toward the write pass preparation voltage $V_{PASS2}$ which has a smaller voltage value than the write pass preparation voltage $V_{PASS3}$. When the write plane number is 1, the output voltage of the voltage generating unit vg2 rises toward the write pass preparation voltage $V_{PASS1}$ which has a smaller voltage value than the write pass preparation voltage $V_{PASS2}$.

Moreover, at timing t102, ON/OFF states of the transistors $T_{VC21}$, $T_{VC22}$, $T_{VC23}$ of the variable capacitance circuit VC2 are controlled depending on the write plane number.

For example, when the write plane number is 4, for example, the transistors $T_{VC21}$, $T_{VC22}$, $T_{VC23}$ become ON. As a result, the capacitors $C_{VC21}$, $C_{VC22}$, $C_{VC23}$ are charged by the voltage generating unit vg2. When the write plane number is 3, for example, the transistors $T_{VC21}$, $T_{VC22}$ become ON, and the transistor $T_{VC23}$ becomes OFF. As a result, the capacitors $C_{VC21}$, $C_{VC22}$ are charged by the voltage generating unit vg2. When the write plane number is 2, for example, the transistors $T_{VC22}$, $T_{VC23}$ become ON, and the transistor $T_{VC21}$ becomes OFF. As a result, the capacitors $C_{VC22}$, $C_{VC23}$ are charged by the voltage generating unit vg2. Note that a combined capacitance of the capacitors $C_{VC22}$, $C_{VC23}$ is smaller than a combined capacitance of the capacitors $C_{VC21}$, $C_{VC22}$. When the write plane number is 1, for example, the transistor $T_{VC23}$ becomes ON, and the transistors $T_{VC21}$, $T_{VC22}$ become OFF. As a result, the capacitor $C_{VC23}$ is charged by the voltage generating unit vg2.

At timing t103, the transistors $T_{DRV2}$, $T_{DRV5}$ of the driver circuit DRV (FIG. 3) are set to ON, and the transistors $T_{DRV1}$, $T_{DRV3}$, $T_{DRV4}$, $T_{DRV6}$ of the driver circuit DRV (FIG. 3) are set to OFF. As a result, the voltage generating unit vg2 and the variable capacitance circuit VC2 are electrically continuous with the selected word line $WL_S$ and the unselected word lines $WL_U$.

Moreover, at timing t103, the output voltage of the voltage generating unit vg2 is set so as to become the write pass voltage $V_{PASS}$ Due to the selected word line $WL_S$ and the unselected word lines $WL_U$ being electrically continuous with the voltage generating unit vg2, the output voltage of the voltage generating unit vg2 once falls after passing timing t103, but then proceeds to rise, and, at timing t104, becomes the write pass voltage $V_{PASS}$.

Note that a configuration may be adopted whereby at timing t103, the output voltage of the voltage generating unit vg2 is set so as to become the write pass voltage $V_{PASS}$, and, at a timing slightly later than timing t103, the voltage generating unit vg2 and the variable capacitance circuit VC2 are electrically continuous with the selected word line $WL_S$ and the unselected word lines $WL_U$. Moreover, conversely, at timing t103, the voltage generating unit vg2 and the variable capacitance circuit VC2 may be made electrically continuous with the selected word line $WL_S$ and the unselected word lines $WL_U$, and, at a timing slightly later than timing t103, the output voltage of the voltage generating unit vg2 may be set so as to become the write pass voltage $V_{PASS}$.

Due to the selected word line $WL_S$ and the unselected word lines $WL_U$ being supplied with the write pass voltage $V_{PASS}$ of the voltage generating circuit vg2 and the charging voltage charged to the variable capacitance circuit VC2, the voltages of the selected word line $WL_S$ and the unselected word lines $WL_U$ proceed to rise from timing t103, and, at timing t104, become the write pass voltage $V_{PASS}$.

At timing t105, the transistors $T_{DRV1}$, $T_{DRV5}$ of the driver circuit DRV (FIG. 3) are set to ON, and the transistors $T_{DRV2}$, $T_{DRV3}$, $T_{DRV4}$, $T_{DRV6}$ of the driver circuit DRV (FIG. 3) are set to OFF. As a result, the voltage generating unit vg1 and the variable capacitance circuit VC1 are electrically continuous with the selected word line $WL_S$. The voltage generating unit vg2 and the variable capacitance circuit VC2 are maintained unchanged electrically continuous with the unselected word lines $WL_U$.

Moreover, at timing t105, the output voltage of the voltage generating unit vg1 is set so as to become the program voltage $V_{PGM1}$. Due to the selected word line $WL_S$ being electrically continuous with the voltage generating unit vg1, the output voltage of the voltage generating unit vg1 once falls after passing timing t105, but then proceeds to rise, and, at timing t106, becomes the program voltage $V_{PGM1}$.

Note that at timing t105, the output voltage of the voltage generating unit vg1 may be set so as to become the program voltage $V_{PGM1}$, and, at a timing slightly later than timing t105, the voltage generating unit vg1 and the variable capacitance circuit VC1 may be made electrically continuous with the selected word line $WL_S$. Moreover, conversely, at timing t105, the voltage generating unit vg1 and the variable capacitance circuit VC1 may be made electrically continuous with the selected word line $WL_S$, and, at a timing slightly later than timing t105, the output voltage of the voltage generating unit vg1 may be set so as to become the program voltage $V_{PGM1}$.

Due to the selected word line $WL_S$ being supplied with the program voltage $V_{PGM1}$ of the voltage generating circuit vg1 and the charging voltage charged to the variable capacitance circuit VC1, the voltage of the selected word line $WL_S$ proceeds to rise from the write pass voltage $V_{PASS}$ at timing t105, and, at timing t106, becomes the program voltage $V_{PGM1}$.

At timing t107, the transistors $T_{DRV2}$, $T_{DRV5}$ of the driver circuit DRV (FIG. 3) are set to ON, and the transistors $T_{DRV1}$, $T_{DRV3}$, $T_{DRV4}$, $T_{DRV6}$ of the driver circuit DRV (FIG. 3) are set to OFF. As a result, the voltage generating unit vg1 and variable capacitance circuit VC1 are cut off from the selected word line $WL_S$, and the voltage generating unit vg2 and variable capacitance circuit VC2 are electrically continuous with the selected word line $WL_S$. The voltage generating unit vg2 and the variable capacitance circuit VC2 are maintained unchanged electrically continuous with the unselected word lines $WL_U$.

The voltage of the selected word line $WL_S$ starts to decrease from timing t107, and, at timing t108, becomes the write pass voltage $V_{PASS}$ Moreover, the output voltage of the voltage generating unit vg1 decreases from timing t107 to timing t108, and decreases from the program voltage $V_{PGM1}$ to a certain voltage (for example, a voltage of about the program preparation voltage $V_{PGM11}$).

At timing t108, the transistors $T_{DRV4}$, $T_{DRV6}$ of the driver circuit DRV (FIG. 3) are set to ON, and the transistors $T_{DRV1}$, $T_{DRV2}$, $T_{DRV3}$, $T_{DRV5}$ of the driver circuit DRV (FIG. 3) are set to OFF. As a result, the selected word line $WL_S$ and the unselected word lines $WL_U$ are supplied with the ground voltage $V_{SS}$, the voltage of the selected word line $WL_S$ becomes the ground voltage $V_{SS}$ at timing t110, and the voltage of the unselected word lines $WL_U$ becomes the ground voltage $V_{SS}$ at timing t109.

Moreover, at timing t108, the output voltage of the voltage generating unit vg2 starts to change toward any one of read pass preparation voltages $V_{READ1}$, $V_{READ2}$, $V_{READ3}$, $V_{READ4}$ depending on the write plane number, and, at timing t109, reaches the anyone of these read pass preparation voltages $V_{READ1}$, $V_{READ2}$, $V_{READ3}$, $V_{READ4}$.

For example, when the write plane number is 4, the output voltage of the voltage generating unit vg2 changes toward the read pass preparation voltage $V_{READ4}$. When the write plane number is 3, the output voltage of the voltage generating unit vg2 changes toward the read pass preparation voltage $V_{READ3}$ which has a smaller voltage value than the read pass preparation voltage $V_{READ4}$. When the write plane number is 2, the output voltage of the voltage generating unit vg2 changes toward the read pass preparation voltage $V_{READ2}$ which has a smaller voltage value than the read pass preparation voltage $V_{READ3}$. When the write plane number is 1, the output voltage of the voltage generating unit vg2 changes toward the read pass preparation voltage $V_{READ1}$ which has a smaller voltage value than the read pass preparation voltage $V_{READ2}$.

Moreover, at timing t108, the ON/OFF states of the transistors $T_{VC21}$, $T_{VC22}$, $T_{VC23}$ of the variable capacitance circuit VC2 are controlled depending on the write plane number.

For example, when the write plane number is 4, for example, the transistors $T_{VC21}$, $T_{VC22}$, $T_{VC23}$ become ON. As a result, the capacitors $C_{VC21}$, $C_{VC22}$, $C_{VC23}$ are charged by the voltage generating unit vg2. When the write plane number is 3, for example, the transistors $T_{VC21}$, $T_{VC22}$ become ON, and the transistor $T_{VC23}$ becomes OFF. As a result, the capacitors $C_{VC21}$, $C_{VC22}$ are charged by the voltage generating unit vg2. When the write plane number is 2, for example, the transistors $T_{VC22}$, $T_{VC23}$ become ON, and the transistor $T_{VC21}$ becomes OFF. As a result, the capacitors $C_{VC22}$, $C_{VC23}$ are charged by the voltage generating unit vg2. When the write plane number is 1, for example, the transistor $T_{VC23}$ becomes ON, and the transistors $T_{VC21}$, $T_{VC22}$ become OFF. As a result, the capacitor $C_{VC23}$ is charged by the voltage generating unit vg2.

Moreover, at timing t109, the output voltage of the voltage generating unit vg3 starts to rise toward any one of verify preparation voltages $V_{VFY11}$, $V_{VFY12}$, $V_{VFY13}$, $V_{VFY14}$, depending on the write plane number, and, at timing t110, reaches the any one of these verify preparation voltages $V_{VFY11}$, $V_{VFY12}$, $V_{VFY13}$, $V_{VFY14}$.

For example, when the write plane number is 4, the output voltage of the voltage generating unit vg3 rises toward the verify preparation voltage $V_{VFY14}$. When the write plane number is 3, the output voltage of the voltage generating unit vg3 rises toward the verify preparation voltage $V_{VFY13}$ which has a smaller voltage value than the verify preparation voltage $V_{VFY14}$. When the write plane number is 2, the output voltage of the voltage generating unit vg3 rises toward the verify preparation voltage $V_{VFY12}$ which has a smaller voltage value than the verify preparation voltage $V_{VFY13}$. When the write plane number is 1, the output voltage of the voltage generating unit vg3 rises toward the verify preparation voltage $V_{VFY11}$ which has a smaller voltage value than the verify preparation voltage $V_{VFY12}$.

Moreover, at timing t109, ON/OFF states of the transistors $T_{VC31}$, $T_{VC32}$, $T_{VC33}$ of the variable capacitance circuit VC3 are controlled depending on the write plane number.

For example, when the write plane number is 4, for example, the transistors $T_{VC31}$, $T_{VC32}$, $T_{VC33}$ become ON. As a result, the capacitors $C_{VC31}$, $C_{VC32}$, $C_{VC33}$ are charged by the voltage generating unit vg3. When the write plane number is 3, for example, the transistors $T_{VC31}$, $T_{VC32}$ become ON, and the transistor $T_{VC33}$ becomes OFF. As a result, the capacitors $C_{VC31}$, $C_{VC32}$ are charged by the voltage generating unit vg3. When the write plane number is 2, for example, the transistors $T_{VC32}$, $T_{VC33}$ become ON, and the transistor $T_{VC31}$ becomes OFF. As a result, the capacitors $C_{VC32}$, $C_{VC33}$ are charged by the voltage generating unit vg3. Note that a combined capacitance of the capacitors $C_{VC32}$, $C_{VC33}$ is smaller than a combined capacitance of the capacitors $C_{VC31}$, $C_{VC32}$. When the write plane number is 1, for example, the transistor $T_{VC33}$ becomes ON, and the transistors $T_{VC31}$, $T_{VC32}$ become OFF. As a result, the capacitor $C_{VC33}$ is charged by the voltage generating unit vg3.

At timing t110, the transistors $T_{DRV4}$, $T_{DRV5}$ of the driver circuit DRV (FIG. 3) are set to ON, and the transistors $T_{DRV1}$, $T_{DRV2}$, $T_{DRV3}$, $T_{DRV6}$ of the driver circuit DRV (FIG. 3) are set to OFF. As a result, the voltage generating unit vg2 and the variable capacitance circuit VC2 are electrically continuous with the unselected word lines $WL_U$. The selected word line $WL_S$ is maintained in a state of being supplied with the ground voltage $V_{SS}$.

Moreover, at timing t110, the output voltage of the voltage generating unit vg2 is set so as to become the read pass voltage $V_{READ}$. Due to the unselected word lines $WL_U$ being electrically continuous with the voltage generating unit vg2, the output voltage of the voltage generating unit vg2 once falls after passing timing t110, but then proceeds to rise, and, at timing t111, becomes the read pass voltage $V_{READ}$ Note that at timing t110, the output voltage of the voltage generating unit vg2 may be set so as to become the read pass voltage $V_{READ}$, and, at a timing slightly later than timing t110, the voltage generating unit vg2 and the variable capacitance circuit VC2 may be made electrically continuous with the unselected word lines $WL_U$. Moreover, conversely, at timing t110, the voltage generating unit vg2 and the variable capacitance circuit VC2 may be made electrically continuous with the unselected word lines $WL_U$, and, at a timing slightly later than timing t110, the output voltage of the voltage generating unit vg2 may be set so as to become the read pass voltage $V_{READ}$ Due to the unselected word lines $WL_U$ being supplied with the read pass voltage $V_{READ}$ of the voltage generating circuit vg2 and the charging voltage charged to the variable capacitance circuit VC2, the voltage of the unselected word lines $WL_U$ proceeds to rise from timing t110, and, at timing t11, becomes the read pass voltage $V_{READ}$ At timing t112, the transistors $T_{DRV3}$, $T_{DRV5}$ of the driver circuit DRV (FIG. 3) are set to ON, and the transistors $T_{DRV1}$, $T_{DRV2}$, $T_{DRV4}$, $T_{DRV6}$ of the driver circuit DRV (FIG. 3) are set to OFF. As a result, the voltage generating unit vg3 and the variable capacitance circuit VC3 are electrically continuous with the selected word line $WL_S$. The voltage generating unit vg2 is maintained unchanged electrically continuous with the unselected word lines $WL_U$.

Moreover, at timing t112, the output voltage of the voltage generating unit vg3 is set so as to become a verify voltage $V_{VFYA}$. Due to the selected word line $WL_S$ being electrically continuous with the voltage generating unit vg3, the output voltage of the voltage generating unit vg3 once falls after passing timing t112, but then proceeds to rise and becomes the verify voltage $V_{VFYA}$.

Note that at timing t112, the output voltage of the voltage generating unit vg3 may be set so as to become the verify voltage $V_{VFYA}$, and, at a timing slightly later than timing t112, the voltage generating unit vg3 and the variable capacitance circuit VC3 may be made electrically continuous with the selected word line $WL_S$. Moreover, conversely, at timing t112, the voltage generating unit vg3 and the variable capacitance circuit VC3 may be made electrically continuous with the selected word line $WL_S$, and, at a timing slightly later than timing t112, the output voltage of the voltage generating unit vg3 may be set so as to become the verify voltage $V_{VFYA}$.

Due to the selected word line $WL_S$ being supplied with the verify voltage $V_{VFYA}$ of the voltage generating circuit vg3 and the charging voltage charged to the variable capacitance circuit VC3, the voltage of the selected word line $WL_S$ proceeds to rise from the ground voltage $V_{SS}$, and becomes the verify voltage $V_{VFYA}$.

At timing t113, the output voltage of the voltage generating unit vg3 is set so as to become a verify voltage $V_{VFYB}$ which is larger than the verify voltage $V_{VFYA}$ As a result, the voltage of the selected word line $WL_S$ becomes the verify voltage $V_{VFYB}$ which is larger than the verify voltage $V_{VFYA}$.

At timing t114, the output voltage of the voltage generating unit vg3 is set so as to become a verify voltage $V_{VFYC}$ which is larger than the verify voltage $V_{VFYB}$ As a result, the voltage of the selected word line $WL_S$ becomes the verify voltage $V_{VFYC}$ which is larger than the verify voltage $V_{VFYB}$.

By performing the sense operation in each of periods when the selected word line $WL_S$ is being supplied with the verify voltage $V_{VFYA}$, the verify voltage $V_{VFYB}$, and the verify voltage $V_{VFYC}$, it is judged whether desired data has been stored in the write memory cell MC, or not.

At timing t115, the transistors $T_{DRV4}$, $T_{DRV6}$ of the driver circuit DRV (FIG. 3) are set to ON, and the transistors $T_{DRV1}$, $T_{DRV2}$, $T_{DRV3}$, $T_{DRV5}$ of the driver circuit DRV (FIG. 3) are set to OFF. As a result, the selected word line $WL_S$ and the unselected word lines $WL_U$ are supplied with the ground voltage $V_{SS}$, and the voltages of the selected word line $WL_S$ and the unselected word lines $WL_U$ become the ground voltage $V_{SS}$ at timing t116.

Moreover, the output voltage of the voltage generating unit vg3 decreases from timing t115 to timing t116, and decreases from the verify voltage $V_{VFYC}$ to a certain voltage value (for example, a voltage of about the verify preparation voltage $V_{VFY11}$).

At timings t202-t215, processing substantially similar to processing executed at timings t102-t115 is executed.

However, at timing t202, the output voltage of the voltage generating unit vg1 is maintained. Moreover, the ON/OFF states of the transistors $T_{VC11}$, $T_{VC12}$, $T_{VC13}$ of the variable capacitance circuit VC1 are maintained.

Moreover, at timing t204, the output voltage of the voltage generating unit vg1 starts to rise toward any one of program preparation voltages $V_{PGM21}$, $V_{PGM22}$, $V_{PGM23}$, $V_{PGM24}$, depending on the write plane number, and, at a timepoint earlier than timing t205, reaches the any one of these program preparation voltages $V_{PGM21}$, $V_{PGM22}$, $V_{PGM23}$, $V_{PGM24}$.

For example, when the write plane number is 4, the output voltage of the voltage generating unit vg1 rises toward the program preparation voltage $V_{PGM24}$ When the write plane number is 3, the output voltage of the voltage generating unit vg1 rises toward the program preparation voltage $V_{PGM23}$ which has a smaller voltage value than the program preparation voltage $V_{PGM24}$ When the write plane number is 2, the output voltage of the voltage generating unit vg1 rises toward the program preparation voltage $V_{PGM22}$ which has a smaller voltage value than the program preparation voltage $V_{PGM23}$ When the write plane number is 1, the output voltage of the voltage generating unit vg1 rises toward the program preparation voltage $V_{PGM21}$ which has a smaller voltage value than the program preparation voltage $V_{PGM22}$. Note that the program preparation voltage $V_{PGM24}$ has a slightly lower voltage value than a program voltage $V_{PGM2}$. For example, the program preparation voltage $V_{PGM24}$ has a voltage value which is about 90% that of the program voltage $V_{PGM2}$. Moreover, the program voltage $V_{PGM2}$ has a slightly higher voltage value than the program voltage $V_{PGM1}$. Moreover, the program preparation voltages $V_{PGM21}$-$V_{PGM24}$ respectively have slightly higher voltage values than the program preparation voltages $V_{PGM11}$-$V_{PGM14}$.

Moreover, at timing t204, the ON/OFF states of the transistors $T_{VC11}$, $T_{VC12}$, $T_{VC13}$ of the variable capacitance circuit VC1 are controlled depending on the write plane number.

For example, when the write plane number is 4, for example, the transistors $T_{VC11}$, $T_{VC12}$, $T_{VC13}$ become ON. As a result, the capacitors $C_{VC11}$, $C_{VC12}$, $C_{VC13}$ are charged by the voltage generating unit vg1. When the write plane number is 3, for example, the transistors $T_{VC11}$, $T_{VC12}$ become ON, and the transistor $T_{VC13}$ becomes OFF. As a result, the capacitors $C_{VC11}$, $C_{VC12}$ are charged by the voltage generating unit vg1. When the write plane number is 2, for example, the transistors $T_{VC12}$, $T_{VC13}$ become ON, and the transistor $T_{VC11}$ becomes OFF. As a result, the capacitors $C_{VC12}$, $C_{VC13}$ are charged by the voltage generating unit vg1. When the write plane number is 1, for example, the transistor $T_{VC13}$ becomes ON, and the transistors $T_{VC11}$, $T_{VC12}$ become OFF. As a result, the capacitor $C_{VC13}$ is charged by the voltage generating unit vg1.

Moreover, at timing t205, the output voltage of the voltage generating unit vg1 is set so as to become the program voltage $V_{PGM2}$. Due to the selected word line $WL_S$ being electrically continuous with the voltage generating unit vg1, the output voltage of the voltage generating unit vg1 once falls after passing timing t205, but then proceeds to rise, and, at timing t206, becomes the program voltage $V_{PGM2}$.

Due to the selected word line $WL_S$ being supplied with the program voltage $V_{PGM2}$ of the voltage generating circuit vg1 and the charging voltage charged to the variable capacitance circuit VC1, the voltage of the selected word line $WL_S$ proceeds to rise from the write pass voltage $V_{PASS}$ at timing t205, and, at timing t206, becomes the program voltage $V_{PGM2}$.

Moreover, at timing t209, the output voltage of the voltage generating unit vg3 starts to rise toward any one of verify preparation voltages $V_{VFY21}$, $V_{VFY22}$, $V_{VFY23}$, $V_{VFY24}$, depending on the write plane number, and, at timing t210, reaches the any one of these verify preparation voltages $V_{VFY21}$, $V_{VFY22}$, $V_{VFY23}$, $V_{VFY24}$.

For example, when the write plane number is 4, the output voltage of the voltage generating unit vg3 rises toward the verify preparation voltage $V_{VFY24}$. When the write plane number is 3, the output voltage of the voltage generating unit vg3 rises toward the verify preparation voltage $V_{VFY23}$ which has a smaller voltage value than the verify preparation voltage $V_{VFY24}$. When the write plane number is 2, the output voltage of the voltage generating unit vg3 rises toward the verify preparation voltage $V_{VFY22}$ which has a smaller voltage value than the verify preparation voltage $V_{VFY23}$. When the write plane number is 1, the output voltage of the voltage generating unit vg3 rises toward the verify preparation voltage $V_{VFY21}$ which has a smaller voltage value than the verify preparation voltage $V_{VFY22}$.

Moreover, at timing t212, the output voltage of the voltage generating unit vg3 is set so as to become the verify voltage $V_{VFYB}$. Due to the selected word line $WL_S$ being electrically continuous with the voltage generating unit vg3, the output voltage of the voltage generating unit vg3 once falls after passing timing t212, but then proceeds to rise and becomes the verify voltage $V_{VFYB}$.

Due to the selected word line $WL_S$ being supplied with the verify voltage $V_{VFYB}$ of the voltage generating circuit vg3 and the charging voltage charged to the variable capacitance circuit VC3, the voltage of the selected word line $WL_S$ proceeds to rise from the ground voltage $V_{SS}$, and becomes the verify voltage $V_{VFYB}$.

At timing t213, the output voltage of the voltage generating unit vg3 is set so as to become the verify voltage $V_{VFYC}$ which is larger than the verify voltage $V_{VFYB}$. As a result, the voltage of the selected word line $WL_S$ becomes the verify voltage $V_{VFYC}$ which is larger than the verify voltage $V_{VFYB}$.

At timing t214, the output voltage of the voltage generating unit vg3 is set so as to become a verify voltage $V_{VFYD}$ which is larger than the verify voltage $V_{VFYC}$. As a result, the voltage of the selected word line $WL_S$ becomes the verify voltage $V_{VFYD}$ which is larger than the verify voltage $V_{VFYC}$.

By performing the sense operation in each of periods when the selected word line $WL_S$ is being supplied with the verify voltage $V_{VFYB}$, the verify voltage $V_{VFYC}$, and the verify voltage $V_{VFYD}$, it is judged whether desired data has been stored in the write memory cell MC, or not.

Advantages

Advantages of the first embodiment will be described in comparison with a comparative example.

In the first embodiment, the output voltages of the voltage generating units vg1, vg2, vg3 can be adjusted depending on the write plane number. Moreover, the voltage generating units vg1, vg2, vg3 are respectively connected with the variable capacitance circuits VC1, VC2, VC3, and charging capacities of the variable capacitance circuits VC1, VC2, VC3 can be adjusted depending on the write plane number.

In contrast, in the comparative example, output voltages of voltage generating units vg1', vg2', vg3' cannot be adjusted depending on the write plane number. Moreover, the comparative example does not have circuits corresponding to the variable capacitance circuits VC1, VC2, VC3 according to the first embodiment.

Figure 15:
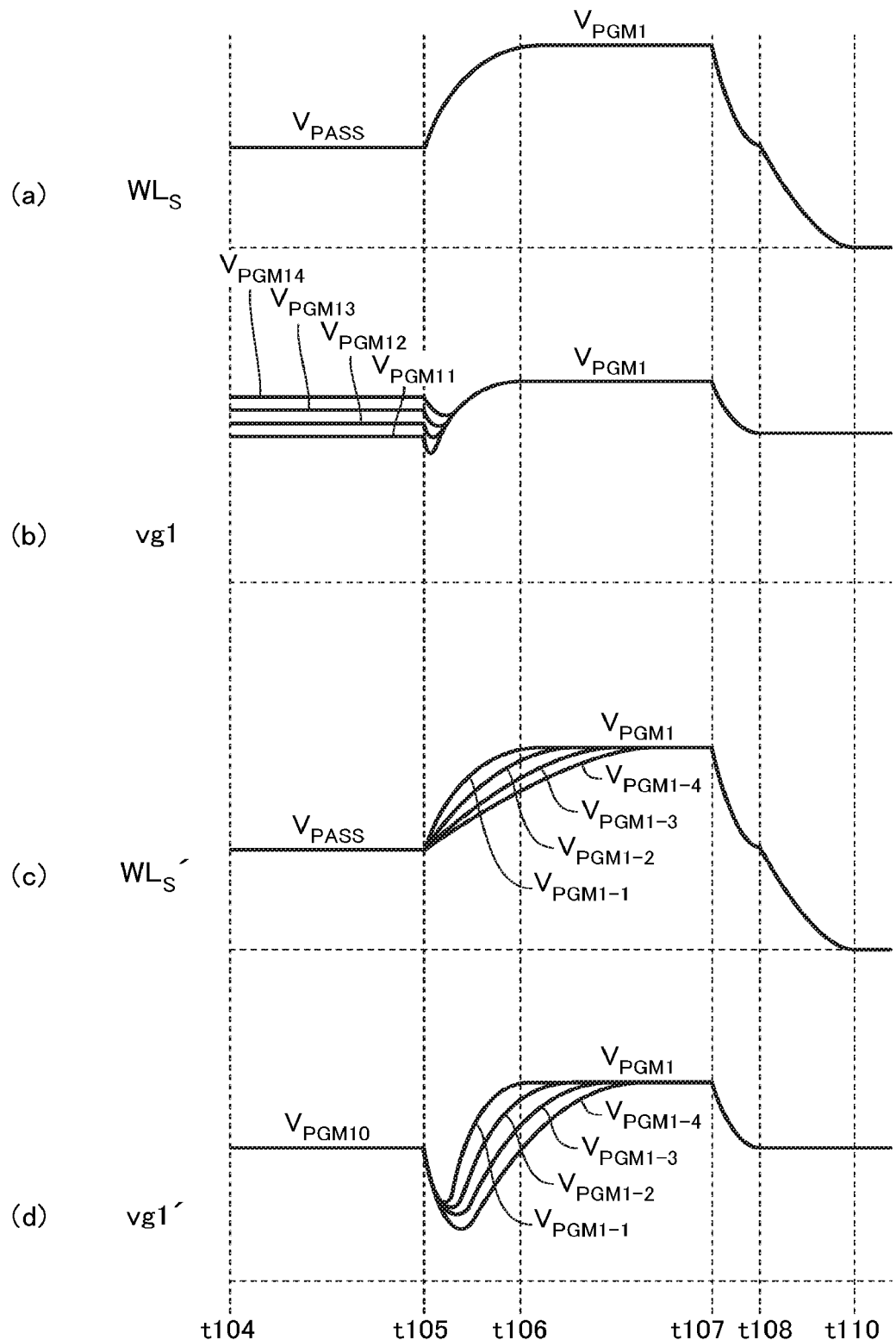
FIG. 15 is a waveform chart for explaining the write operation.

FIG. 15 is a waveform chart in which, for a period from timing t104 to timing t110, there are shown in a comparative manner: a voltage waveform of the selected word line $WL_S$ (FIG. 15(a)) and output voltage waveform of the voltage generating unit vg1 (FIG. 15(b)), of the first embodiment; and a voltage waveform of a selected word line $WL_S'$ (FIG. 15(c)) and output voltage waveform of the voltage generating unit vg1' (FIG. 15(d)), of the comparative example.

In the first embodiment, from timing t104 to timing t105, as shown in FIG. 15(b), the output voltage of the voltage generating unit vg1 is set to the program preparation voltage $V_{PGM14}$ when the write plane number is 4, is set to the program preparation voltage $V_{PGM13}$ when the write plane number is 3, is set to the program preparation voltage $V_{PGM12}$ when the write plane number is 2, and is set to the program preparation voltage $V_{PGM11}$ when the write plane number is 1.

Moreover, in the variable capacitance circuit VC1, the capacitors $C_{VC11}$, $C_{VC12}$, $C_{VC13}$ are charged when the write plane number is 4, the capacitors $C_{VC11}$, $C_{VC12}$ are charged when the write plane number is 3, the capacitors $C_{VC12}$, $C_{VC13}$ are charged when the write plane number is 2, and the capacitor $C_{VC13}$ is charged when the write plane number is 1.

In contrast, in the comparative example, from timing t104 to timing t105, as shown in FIG. 15(d), the output voltage of the voltage generating unit vg1' is set to a program preparation voltage $V_{PGM10}$, regardless of the write plane number.

In the first embodiment, at timing t105, the voltage generating unit vg1 and the variable capacitance circuit VC1 are electrically continuous with the selected word line $WL_S$, and the output voltage of the voltage generating unit vg1 is set so as to become $V_{PGM1}$. As shown in FIG. 15(b), the output voltage of the voltage generating unit vg1 once falls after passing timing t105, but then proceeds to rise, and, at timing t106, becomes the program voltage $V_{PGM1}$. At this time, rise characteristics with which the output voltage of the voltage generating unit vg1 proceeds to rise after passing timing t105 are substantially constant, regardless of the write plane number. This is because the higher the write plane number is, the larger the program preparation voltage is made, and the larger the charging capacity of charging to the variable capacitance circuit VC1 is made. That is, the first embodiment displays an advantage that, even when the write plane numbers differ, the rise characteristics of the voltage value of the selected word line $WL_S$, and consequently, voltage rise characteristics of the selected memory cells, are uniform.

In contrast, in the comparative example, at timing t105, the voltage generating unit vg1' is electrically continuous with the selected word line $WL_S'$, and the output voltage of the voltage generating unit vg1' is set so as to become $V_{PGM1}$. As shown in FIG. 15(d), the output voltage of the voltage generating unit vg1' once falls after passing timing t105, but then proceeds to rise, and, at a timing close to timing t107, becomes the program voltage $V_{PGM1}$. At this time, rise characteristics with which the output voltage of the voltage generating unit vg1' proceeds to rise after passing timing t105 differ according to the write plane number. In other words, in FIG. 15(d), the rise characteristics of the output voltage of the voltage generating unit vg1' become as shown by symbol $V_{PGM1\text{-}4}$ when the write plane number is 4, become as shown by symbol $V_{PGM1\text{-}3}$ when the write plane number is 3, become as shown by symbol $V_{PCM1\text{-}2}$ when the write plane number is 2, and become as shown by symbol $V_{PGM1\text{-}1}$ when the write plane number is 1. Thus, the higher the write plane number is, the gentler the rise characteristics of the output voltage of the voltage generating unit vg1' become, and the longer a time until the program voltage $V_{PGM1}$ is settled on, is.

Due to that, in the comparative example, the rise characteristics with which the output voltage of the voltage generating unit vg1' proceeds to rise after passing timing t105 differ according to the write plane number in this way, rise characteristics of the voltage value of the selected word line $WL_S'$ differ according to the write plane number, as shown from timing t105 to timing t107 in FIG. 15(c). In other words, in FIG. 15(c), the rise characteristics of the voltage value of the selected word line $WL_S'$ become as shown by symbol $V_{PGM1\text{-}4}$ when the write plane number is 4, become as shown by symbol $V_{PGM1\text{-}3}$ when the write plane number is 3, become as shown by symbol $V_{PGM1\text{-}2}$ when the write plane number is 2, and become as shown by symbol $V_{PGM1\text{-}1}$ when the write plane number is 1. Thus, the higher the write plane number is, the gentler the rise characteristics of the voltage value of the selected word line $WL_S'$ become, and the longer a time until the program voltage $V_{PGM1}$ is settled on, is. Thus, in the comparative example, when the write plane numbers differ, the rise characteristics of the voltage value of the selected word line $WL_S'$, and consequently, rise characteristics of the threshold voltages of the selected memory cells differ.

Furthermore, in the first embodiment, in the voltage generating units vg2, vg3, the higher the write plane number is, the larger the write pass preparation voltage, read pass preparation voltage, and verify preparation voltage are made, and the larger the charging capacities of charging to the variable capacitance circuits VC2, VC3 are made. Therefore, when the write pass voltage $V_{PASS}$ is supplied to the selected word line $WL_S$ and the unselected word lines $WL_U$ from the voltage generating unit vg2, rise characteristics of the voltage value of the voltage generating unit vg2 become constant regardless of the write plane number, and rise characteristics of the voltage values of the selected word line $WL_S$ and the unselected word lines $WL_U$ become constant regardless of the write plane number. Moreover, when the read pass voltage $V_{READ}$ is supplied to the unselected word lines $WL_U$ from the voltage generating unit vg2, rise characteristics of the voltage value of the voltage generating unit vg2 become constant regardless of the write plane number, and rise characteristics of the voltage value of the unselected word lines $WL_U$ become constant regardless of the write plane number. Moreover, when the verify voltage $V_{VFY}$ is supplied to the selected word line $WL_S$ from the voltage generating unit vg3, rise characteristics of the voltage value of the voltage generating unit vg3 become constant regardless of the write plane number, and rise characteristics of the voltage value of the unselected word lines $WL_U$ become constant regardless of the write plane number.

In contrast, in the comparative example, when the write pass voltage $V_{PASS}$ is supplied to the selected word line $WL_S'$ and unselected word lines $WL_U'$ from the voltage generating unit vg2', when the read pass voltage $V_{READ}$ is supplied to the unselected word lines $WL_U'$ from the voltage generating unit vg2', or when the verify voltage $V_{VFY}$ is supplied to the selected word line $WL_S'$ from the voltage generating unit vg3', rise characteristics of the voltage values of the selected word line $WL_S'$ or unselected word lines $WL_U'$ differ depending on the write plane number.

Second Embodiment

Figure 16:
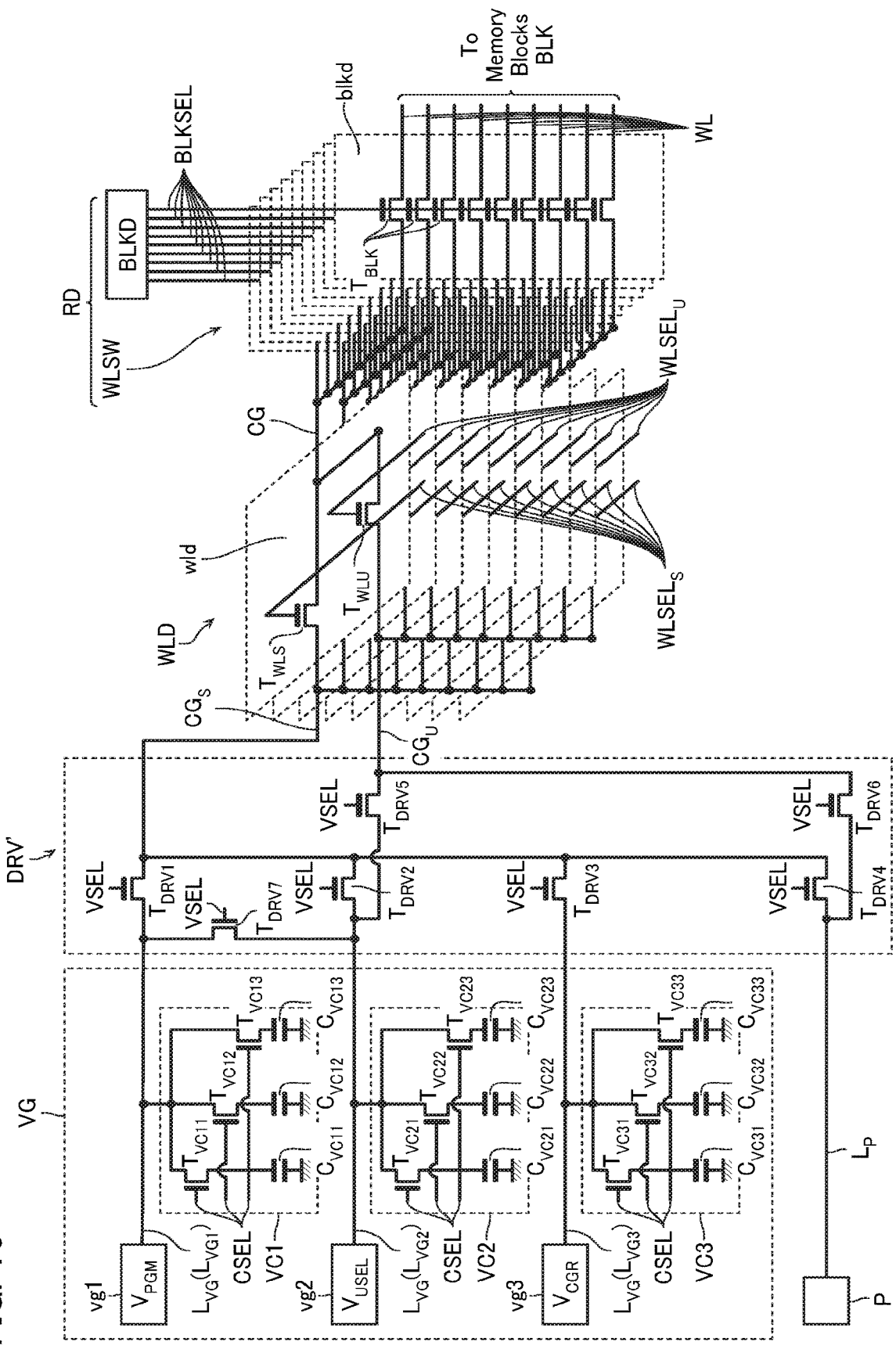
FIG. 16 is a schematic circuit diagram showing a voltage supply route from a voltage generating circuit VG to a memory block BLK, adopted in a semiconductor memory device according to a second embodiment.

Next, a semiconductor memory device according to a second embodiment will be described with reference to FIG. 16. FIG. 16 is a schematic circuit diagram showing a configuration of part of the semiconductor memory device according to the second embodiment.

The semiconductor memory device according to the second embodiment is basically configured similarly to the semiconductor memory device according to the first embodiment. However, as shown in FIG. 16, the semiconductor memory device according to the second embodiment comprises a driver circuit DRV' instead of the driver circuit DRV. The driver circuit DRV' is basically configured similarly to the driver circuit DRV. However, the driver circuit DRV' comprises a transistor $T_{DRV7}$ in addition to the transistors $T_{DRV1}$, $T_{DRV2}$, $T_{DRV3}$, $T_{DRV4}$, $T_{DRV5}$, $T_{DRV6}$. The transistor $T_{DRV7}$ is a field effect type NMOS transistor, for example. A drain electrode of the transistor $T_{DRV7}$ is connected to the voltage generating unit vg1 via the voltage supply line $L_{VG1}$. A source electrode of the transistor $T_{DRV7}$ is connected to the voltage generating unit vg2 via the voltage supply line $L_{VG2}$. A gate electrode of the transistor $T_{DRV7}$ is connected to the sequencer SQC (FIG. 1) via the signal supply line VSEL. The sequencer SQC performs ON/OFF control of the transistor $T_{DRV7}$ via the signal supply line VSEL.

Now, as mentioned above, at timing t103 in FIG. 14, for example, the unselected word lines $WL_U$ are supplied with the write pass voltage $V_{PASS}$. Now, due to there being a large number of the unselected word lines $WL_U$, sometimes, charging of the unselected word lines $WL_U$ takes time. Accordingly, in the present embodiment, the voltage generating unit vg1 is made electrically continuous with the wiring $CG_U$ via the transistor $T_{DRV7}$. Moreover, at a timing corresponding to timing t103 of FIG. 14, not only the voltage generating unit vg2, but also the voltage generating unit vg1 is utilized to perform charging of the unselected word lines $WL_U$. This makes it possible for charging time of the unselected word lines $WL_U$ to be shortened.

Next, a write operation of the second embodiment will be described with reference to FIG. 17. Note that description of portions similar to in the write operation of the first embodiment will be omitted.

In the previously mentioned first embodiment, as shown in FIG. 14, at timing t102, the output voltage of the voltage generating unit vg1 starts to rise toward any one of the program preparation voltages $V_{PGM11}$, $V_{PGM12}$, $V_{PGM13}$, $V_{PGM14}$, depending on the write plane number. Moreover, at timings till, t211, the output voltage of the voltage generating unit vg1 is the certain voltage (for example, the voltage of about the program preparation voltage $V_{PGM11}$ or about the program preparation voltage $V_{PGM21}$).

Figure 17:
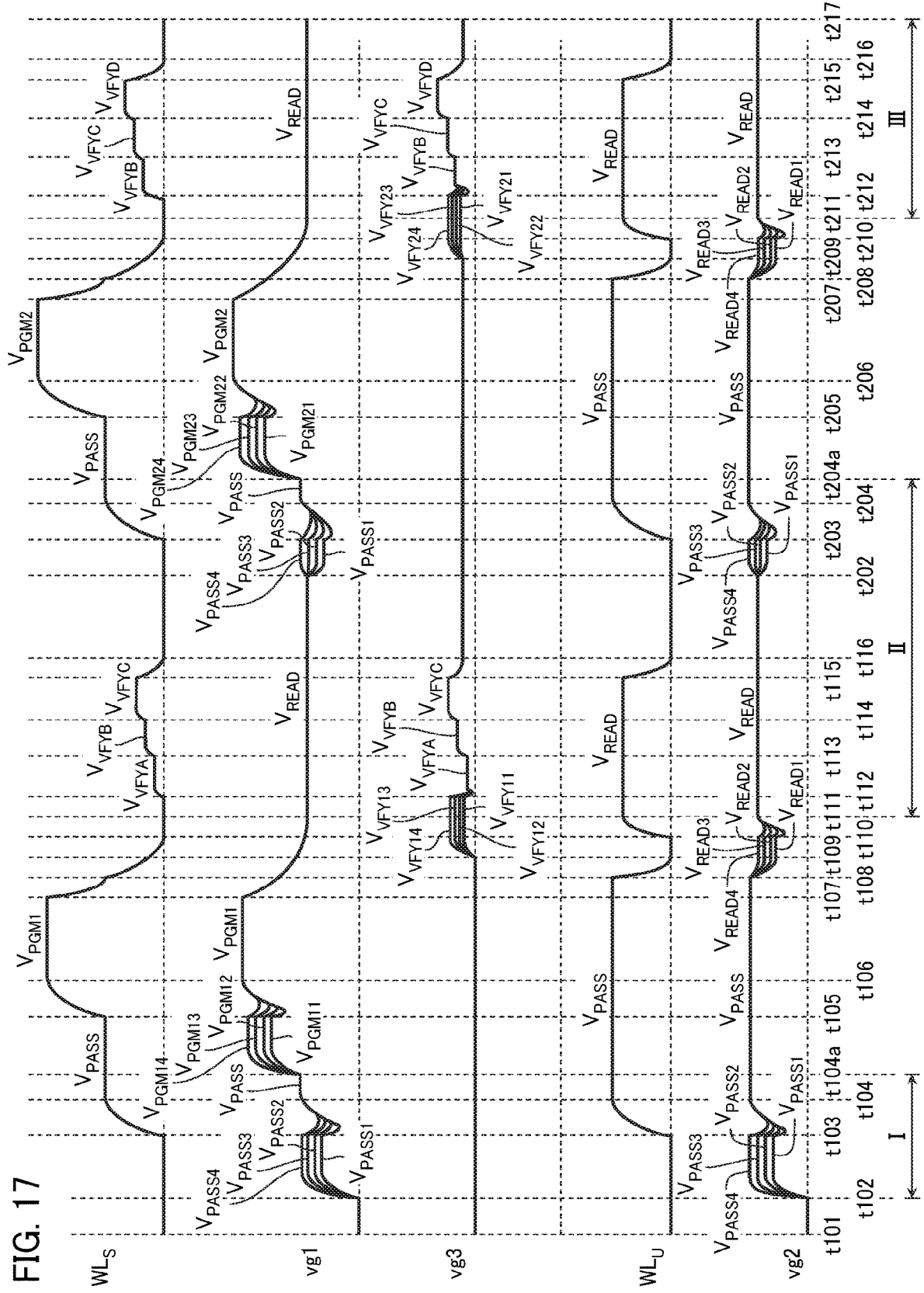
FIG. 17 is a waveform chart for explaining a write operation in the second embodiment.

In contrast, in the second embodiment, in a period I from timing t102 to timing t104a, a period II from timing till to timing t204a, and a period III from timing t211 to timing t217 that are shown in FIG. 17, the transistor $T_{DRV7}$ becomes ON. Moreover, in the periods I, II, III, the voltage value of the voltage supply line $L_{VG1}$ (in other words, a voltage value of an output end of the voltage generating unit vg1) is controlled so as to match the voltage value of the output voltage of the voltage generating unit vg2. Note that in other periods besides the periods I, II, III, the transistor $T_{DRV7}$ becomes OFF.

Moreover, as shown in FIG. 17, the voltage of the output end of the voltage generating unit vg1 becomes the write pass voltage $V_{PASS}$ at timing t104.

At timing t104a, the output voltage of the voltage generating unit vg1 starts to rise toward any one of the program preparation voltages $V_{PGM11}$, $V_{PGM12}$, $V_{PGM13}$, $V_{PGM14}$, depending on the write plane number, and, at timing t105, reaches the any one of these program preparation voltages $V_{PGM11}$, $V_{PGM12}$, $V_{PGM13}$, $V_{PGM14}$.

Moreover, at timing t104a, the ON/OFF states of the transistors $T_{VC11}$, $T_{VC12}$, $T_{VC13}$ of the variable capacitance circuit VC1 are controlled similarly to in the first embodiment.

Moreover, as shown in FIG. 17, the voltage of the output end of the voltage generating unit vg1 becomes the write pass voltage $V_{PASS}$ at timing t204.

At timing t204a, the output voltage of the voltage generating unit vg1 starts to rise toward any one of the program preparation voltages $V_{PGM21}$, $V_{PGM22}$, $V_{PGM23}$, $V_{PGM24}$, depending on the write plane number, and, at timing t205, reaches the any one of these program preparation voltages $V_{PGM21}$, $V_{PGM22}$, $V_{PGM23}$, $V_{PGM24}$.

Moreover, at timing t204a, the ON/OFF states of the transistors $T_{VC11}$, $T_{VC12}$, $T_{VC13}$ of the variable capacitance circuit VC1 are controlled similarly to in the first embodiment.

Note that operation at each of the timings, excluding the above-mentioned operation in periods of the periods I, II, III and the above-mentioned operation at timings t104, t104a, t204, t204a, is similar to operation in the first embodiment.

Third Embodiment

A semiconductor memory device according to a third embodiment is basically configured similarly to the semiconductor memory device according to the first or second embodiment.

However, the semiconductor memory devices according to the first and second embodiments comprises the variable capacitance circuits VC1, VC2, VC3. Moreover, in the first and second embodiments, control of electrostatic capacitance dependent on the write plane number is performed in the variable capacitance circuits VC1, VC2, VC3.

In contrast, the semiconductor memory device according to the third embodiment does not comprise the variable capacitance circuits VC1, VC2, VC3.

Fourth Embodiment

A semiconductor memory device according to a fourth embodiment is basically configured similarly to the semiconductor memory device according to the first or second embodiment.

However, in the first and second embodiments, voltage control dependent on the write plane number is performed in the voltage generating units vg1, vg2, vg3.

In contrast, in the semiconductor memory device according to the fourth embodiment, the above-mentioned kind of voltage control dependent on the write plane number is not performed.

Fifth Embodiment

A semiconductor memory device according to a fifth embodiment is basically configured similarly to the semiconductor memory device according to the first, second, or fourth embodiment.

However, in the semiconductor memory devices according to the first, second, and fourth embodiments, control of electrostatic capacitance dependent on the write plane number is performed in a state of the voltage generating units vg1, vg2, vg3 having been electrically cut off from the word lines WL, and so on.

In the semiconductor memory device according to the fifth embodiment, control of electrostatic capacitance dependent on the write plane number is performed also in a state of the voltage generating units vg1, vg2, vg3 being electrically continuous with the word lines WL, and so on, in addition to there being performed this control in the electrically cut-off state.

For example, in the fifth embodiment, similarly to in the first, second, and fourth embodiments, in the variable capacitance circuits VC1, VC2, VC3, certain capacitors are charged depending on the write plane number. Next, the variable capacitance circuits VC1, VC2, VC3 are made electrically continuous with the selected word line $WL_S$ and the unselected word lines $WL_U$. Next, at a timepoint when a certain time has elapsed after the variable capacitance circuits VC1, VC2, VC3 being made electrically continuous with the word lines WL, and so on, transistors that had been ON, of each of the transistors of the variable capacitance circuits VC1, VC2, VC3, are set to OFF, and transistors that had been OFF, of each of the transistors of the variable capacitance circuits VC1, VC2, VC3, are set to ON. As a result, the capacitors that had been charged depending on the write plane number are cut off from the voltage supply line $L_{VG}$, and consequently, from the selected word line $WL_S$ or unselected word lines $WL_U$, and the capacitors that had not been charged are electrically continuous with the voltage supply line $L_{VG}$, and consequently, with the selected word line $WL_S$ or unselected word lines $WL_U$.

Now, when the write plane number is 4, for example, impedance in a current path between the voltage generating circuit VG and the word lines WL is comparatively large. On the other hand, when the write plane number is 1, for example, impedance in a current path between the voltage generating circuit VG and the word lines WL is comparatively small. Now, the semiconductor memory devices according to the first through fourth embodiments make it possible for the rise characteristics of the voltage value of the word lines WL to be uniformized to a certain extent by adjusting amounts of charge outputted from the voltage generating circuit VG. However, there is a risk that, after a certain time has elapsed from start of charging, the difference of impedances in the above-described current paths more strongly affects charging speed.

Now, in the semiconductor memory device according to the present embodiment, reversing the ON/OFF states of each of the transistors of the variable capacitance circuits VC1, VC2, VC3 when the write plane number is 4, for example, makes it possible for impedance in the above-described current path to be reduced during charging of the word lines WL. Moreover, reversing the ON/OFF states of each of the transistors of the variable capacitance circuits VC1, VC2, VC3 when the write plane number is 1, for example, makes it possible for impedance in the above-described current path to be increased during charging of the word lines WL.

By thus uniformizing impedances of each of the current paths, the rise characteristics of the output voltages of the voltage generating units vg1, vg2, vg3 after the variable capacitance circuits VC1, VC2, VC3 have been made electrically continuous with the selected word line $WL_S$ or unselected word lines $WL_U$ further uniformize regardless of the write plane number, and consequently, the rise characteristics of the voltage values of the selected word line $WL_S$ or unselected word lines $WL_U$ also further uniformize regardless of the write plane number. There is thus displayed an advantage that the voltage rise characteristics of the selected memory cells are uniform. Note that control to reverse the ON/OFF states of each of the transistors of the variable capacitance circuits VC1, VC2, VC3 simply reverses a switching operation state of each of the transistors, so can be comparatively easily performed.

Sixth Embodiment

A semiconductor memory device according to a sixth embodiment is basically configured similarly to the semiconductor memory device according to any of the first through fifth embodiments.

However, in the first through fifth embodiments, at least one of voltage and electrostatic capacitance is controlled depending on the write plane number, regardless of which of the four memory cell arrays MCA of the kind exemplified in FIG. 8 is selected.

In contrast, in the sixth embodiment, at least one of voltage and electrostatic capacitance is controlled depending on which of the four memory cell arrays MCA of the kind exemplified in FIG. 8 is selected, and which of them is not selected. For example, the higher the write plane number is, moreover, the further the memory cell array MCA (FIG. 8) undergoing the write operation is separated from the voltage generating circuit VG (FIG. 8), the larger the above-described preparation voltages are made, and the larger the charging capacities of charging to the variable capacitance circuits VC1, VC2, VC3 are made.

Now, in a structure of the kind exemplified in FIG. 8, for example, distances from the voltage generating circuit VG of each of the memory cell arrays MCA differ. Hence, even when the write plane numbers are identically 2, the rise characteristics of the voltage values in the word lines WL, and so on, sometimes differ between when the write operation is performed on the 2 memory cell arrays MCA close to the voltage generating circuit VG and when the write operation is performed on the 2 memory cell arrays MCA far from the voltage generating circuit VG. Due to the semiconductor memory device according to the sixth embodiment, even in such a case, the rise characteristics of the output voltages of the voltage generating units vg1, vg2, vg3 are uniformized regardless of the write plane number, and consequently, the rise characteristics of the voltage values of the selected word line $WL_S$ or unselected word lines $WL_U$ are also uniformized regardless of the write plane number. There is thus displayed an advantage that the voltage rise characteristics of the selected memory cells are uniform.

Note that when the above-mentioned control is performed, preparation voltages of the voltage generating units vg1, vg2, vg3 and charging capacities of charging to the variable capacitance circuits VC1, VC2, VC3 are preset according to a plurality of patterns combining each of the numbers of write planes and each of the distances between the memory cell arrays MCA undergoing the write operation and the voltage generating circuit VG. Moreover, when the above-mentioned control is performed, the number of write planes and the distances between the memory cell arrays MCA undergoing the write operation and the voltage generating circuit VG are judged, and the preparation voltages outputted from the voltage generating units vg1, vg2, vg3 and charging capacities of charging to the variable capacitance circuits VC1, VC2, VC3 are controlled depending on the pattern matching the write plane number and distances at this time.

Other Embodiments

That concludes description of the first through sixth embodiments. However, the above description is merely an exemplification, and specific configurations, and so on, may be appropriately changed.

For example, the semiconductor memory devices according to the first through sixth embodiments comprise four memory cell arrays MCA aligned in the X direction, as described with reference to FIG. 8. However, the number and disposition of the memory cell arrays MCA is appropriately adjustable. For example, the plurality of memory cell arrays MCA may be aligned not only in the X direction, but also in the Y direction. In such a case too, it is possible for circuit configurations and operation similar to those of the semiconductor memory devices according to the first through sixth embodiments to be adopted.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising a memory die,
   the memory die comprising:
      a first memory cell array that comprises a plurality of first memory blocks;
      a second memory cell array that comprises a plurality of second memory blocks; and
      a first voltage supply line which is electrically connected to the plurality of first memory blocks and the plurality of second memory blocks, wherein
   the semiconductor memory device is configured to execute a write operation,
   at a first timing of the write operation, the first voltage supply line is not electrically continuous with any one of the plurality of first memory blocks and the plurality of second memory blocks,
   in the case of the write operation being executed on any one of the plurality of first memory blocks and not being executed on any one of the plurality of second memory blocks, the first voltage supply line is supplied with a first voltage at the first timing,
   in the case of the write operation being executed on any one of the plurality of first memory blocks and being executed on any one of the plurality of second memory blocks, the first voltage supply line is supplied with a second voltage at the first timing, and
   the second voltage being is larger than the first voltage.

2. The semiconductor memory device according to claim 1, wherein
   when a voltage of the first voltage supply line at the first timing in the case of the write operation being executed on any one of the plurality of second memory blocks and not being executed on any one of the plurality of first memory blocks is assumed to be a third voltage, the third voltage is smaller than the first voltage.

3. The semiconductor memory device according to claim 1, further comprising
   a second voltage supply line which is electrically connected to the plurality of first memory blocks and the plurality of second memory blocks, wherein
   at a second timing of the write operation, the second voltage supply line is not electrically continuous with any one of the plurality of first memory blocks and the plurality of second memory blocks,
   in the case of the write operation being executed on any one of the plurality of first memory blocks and not being executed on any one of the plurality of second memory blocks, the second voltage supply line is supplied with a fourth voltage at the second timing,
   in the case of the write operation being executed on any one of the plurality of first memory blocks and being executed on any one of the plurality of second memory blocks, the second voltage supply line is supplied with a fifth voltage at the second timing,
   the fourth voltage is smaller than the second voltage,
   the fifth voltage is smaller than the first voltage, and
   the fifth voltage is larger than the fourth voltage.

4. The semiconductor memory device according to claim 3, wherein
   when a voltage of the second voltage supply line at the second timing in the case of the write operation being executed on any one of the plurality of second memory blocks and not being executed on any one of the plurality of first memory blocks is assumed to be a sixth voltage, the sixth voltage is smaller than the fourth voltage.

5. The semiconductor memory device according to claim 3, wherein
   the second timing is equal to the first timing.

6. The semiconductor memory device according to claim 3, wherein
   the second timing is an earlier timing than the first timing.

7. The semiconductor memory device according to claim 6, wherein
   in the case of the write operation being executed on any one of the plurality of first memory blocks and not being executed on any one of the plurality of second memory blocks, the first voltage supply line is supplied with the fourth voltage at the second timing, and
   in the case of the write operation being executed on any one of the plurality of first memory blocks and being executed on any one of the plurality of second memory blocks, the first voltage supply line is supplied with the fifth voltage at the second timing.

8. The semiconductor memory device according to claim 7, wherein
   at a third timing between the second timing and the first timing, the first voltage supply line and the second voltage supply line are supplied with a seventh voltage, and
   the seventh voltage is larger than the fourth voltage, and smaller than the second voltage.

9. The semiconductor memory device according to claim 1, further comprising:
   a first capacitor which is electrically connected to the first voltage supply line; and
   a first transistor which is provided in a current path between the first voltage supply line and the first capacitor.

10. The semiconductor memory device according to claim 9, wherein
    in the case of the write operation being executed on any one of the plurality of first memory blocks and not being executed on any one of the plurality of second memory blocks, the first capacitor is electrically continuous with the first voltage supply line at the first timing, and
    in the case of the write operation being executed on any one of the plurality of first memory blocks and being executed on any one of the plurality of second memory blocks, the first capacitor is not electrically continuous with the first voltage supply line at the first timing.

11. The semiconductor memory device according to claim 9, further comprising:
    a second capacitor which is electrically connected to the first voltage supply line; and
    a second transistor which is provided in a current path between the first voltage supply line and the second capacitor.

12. The semiconductor memory device according to claim 11, wherein
    in the case of the write operation being executed on any one of the plurality of first memory blocks and not being executed on any one of the plurality of second memory blocks,
    at the first timing, the first capacitor is electrically continuous with the first voltage supply line, and the second capacitor is not electrically continuous with the first voltage supply line, and at a third timing later than the first timing, the first capacitor is not electrically continuous with the first voltage supply line, and the second capacitor is electrically continuous with the first voltage supply line.

13. The semiconductor memory device according to claim 1, wherein the first memory block comprises:

a first memory string including a plurality of first memory cells; and a plurality of first word lines connected to the plurality of first memory cells, the second memory block comprises:

a second memory string including a plurality of second memory cells; and a plurality of second word lines connected to the plurality of second memory cells, and the first voltage supply line is electrically connected to at least one of the plurality of first word lines and at least one of the plurality of second word lines.

14. A semiconductor memory device comprising a memory die, the memory die comprising:

a first memory cell array that comprises a plurality of first memory blocks;

a second memory cell array that comprises a plurality of second memory blocks;

a first voltage supply line which is electrically connected to the plurality of first memory blocks and the plurality of second memory blocks;

a first capacitor which is electrically connected to the first voltage supply line; and a first transistor which is provided in a current path between the first voltage supply line and the first capacitor.

15. The semiconductor memory device according to claim 14, wherein the semiconductor memory device is configured to execute a write operation, at a first timing of the write operation, the first voltage supply line is not electrically continuous with any one of the plurality of first memory blocks and the plurality of second memory blocks, in the case of the write operation being executed on any one of the plurality of first memory blocks and not being executed on any one of the plurality of second memory blocks, the first capacitor is electrically continuous with the first voltage supply line at the first timing, and in the case of the write operation being executed on any one of the plurality of first memory blocks and being executed on any one of the plurality of second memory blocks, the first capacitor is not electrically continuous with the first voltage supply line at the first timing.

16. The semiconductor memory device according to claim 14, comprising:

a second capacitor which is electrically connected to the first voltage supply line; and a second transistor which is provided in a current path between the first voltage supply line and the second capacitor.

17. The semiconductor memory device according to claim 16, wherein the semiconductor memory device is configured to execute a write operation, at a first timing of the write operation, the first voltage supply line is not electrically continuous with any one of the plurality of first memory blocks and the plurality of second memory blocks, and in the case of the write operation being executed on any one of the plurality of first memory blocks and not being executed on any one of the plurality of second memory blocks, at the first timing, the first capacitor is electrically continuous with the first voltage supply line, and the second capacitor is not electrically continuous with the first voltage supply line, and at a third timing later than the first timing, the first capacitor is not electrically continuous with the first voltage supply line, and the second capacitor is electrically continuous with the first voltage supply line.

18. The semiconductor memory device according to claim 14, wherein the first memory block comprises:

a first memory string including a plurality of first memory cells; and a plurality of first word lines connected to the plurality of first memory cells, the second memory block comprises:

a second memory string including a plurality of second memory cells; and a plurality of second word lines connected to the plurality of second memory cells, and the first voltage supply line is electrically connected to at least one of the plurality of first word lines and at least one of the plurality of second word lines.

\* \* \* \* \*